(12) United States Patent
Bowler et al.

(10) Patent No.: US 8,867,371 B2
(45) Date of Patent: Oct. 21, 2014

(54) ESTIMATING PHYSICAL LOCATIONS OF NETWORK FAULTS

(75) Inventors: David B. Bowler, Acton, MA (US);
Brian M. Basile, Lancaster, MA (US);
Clarke V. Greene, Middletown, CT (US); Xiang He, Woburn, MA (US)

(73) Assignee: Motorola Mobility LLC, Libertyville, IL (US)

( * ) Notice: Subject to any disclaimer, the term of this patent is extended or adjusted under 35 U.S.C. 154(b) by 183 days.

(21) Appl. No.: 13/458,504

(22) Filed: Apr. 27, 2012

(65) Prior Publication Data

US 2013/0286852 A1    Oct. 31, 2013

(51) Int. Cl.
*H04L 12/26*       (2006.01)
*H04L 1/00*        (2006.01)
*G01R 31/08*       (2006.01)

(52) U.S. Cl.
CPC .. *H04L 1/00* (2013.01); *G01R 31/08* (2013.01)
USPC .......................................... 370/242; 370/248

(58) Field of Classification Search
CPC ....................................................... H04L 12/26
USPC .................................................. 370/242, 248
See application file for complete search history.

(56) References Cited

U.S. PATENT DOCUMENTS

| | | |
|---|---|---|
| 3,838,221 A | 9/1974 | Schmidt et al. |
| 4,245,342 A | 1/1981 | Entenman |
| 4,385,392 A | 5/1983 | Angell et al. |
| 4,811,360 A | 3/1989 | Potter |
| 4,999,787 A | 3/1991 | McNally et al. |
| 5,228,060 A | 7/1993 | Uchiyama |
| 5,251,324 A | 10/1993 | McMullan |
| 5,271,060 A | 12/1993 | Moran et al. |

(Continued)

FOREIGN PATENT DOCUMENTS

| | | |
|---|---|---|
| DE | 69631420 T2 | 12/2004 |
| EP | 1235402 A2 | 8/2002 |

(Continued)

OTHER PUBLICATIONS

Patent Cooperation Treaty, International Search Report and Written Opinion of the International Searching Authority for International Application No. PCT/US2013/038217, Aug. 5, 2013, 11 pages.

(Continued)

*Primary Examiner* — Wei Zhao
(74) *Attorney, Agent, or Firm* — Honigman Miller Schwartz and Cohn LLP

(57) ABSTRACT

A method of estimating a physical location of a network fault is provided. Information is received concerning the physical topology of the network by data pulls of information concerning network components and terminal network elements and geographic locations thereof. A network fault is detected by monitoring at least one performance parameter transmitted via upstream communications from the terminal network elements, and a physical location of a network fault is estimated based on the performance parameter, the physical topology of the network, and the terminal network element or elements from which the performance parameter was received that indicated the network fault. A list of network components that require inspection and that may provide a source of the network fault is generated. A signal processing electronic device for mapping the network fault and a non-transitory computer readable storage medium having computer program instructions are also provided.

18 Claims, 17 Drawing Sheets

(56) References Cited

U.S. PATENT DOCUMENTS

| | | | |
|---|---|---|---|
| 5,278,977 A | 1/1994 | Spencer et al. |
| 5,347,539 A | 9/1994 | Sridhar et al. |
| 5,390,339 A | 2/1995 | Bruckert et al. |
| 5,463,661 A | 10/1995 | Moran et al. |
| 5,532,865 A | 7/1996 | Utsumi et al. |
| 5,557,603 A | 9/1996 | Barlett et al. |
| 5,606,725 A | 2/1997 | Hart |
| 5,631,846 A | 5/1997 | Szurkowski |
| 5,694,437 A | 12/1997 | Yang et al. |
| 5,732,104 A | 3/1998 | Brown et al. |
| 5,771,274 A | 6/1998 | Harris |
| 5,790,523 A | 8/1998 | Ritchie et al. |
| 5,862,451 A | 1/1999 | Grau et al. |
| 5,867,539 A | 2/1999 | Koslov |
| 5,870,429 A | 2/1999 | Moran et al. |
| 5,886,749 A | 3/1999 | Williams et al. |
| 5,939,887 A | 8/1999 | Schmidt et al. |
| 5,943,604 A | 8/1999 | Chen et al. |
| 6,032,019 A | 2/2000 | Chen et al. |
| 6,061,393 A | 5/2000 | Tsui et al. |
| 6,108,351 A | 8/2000 | Hardy et al. |
| 6,154,503 A | 11/2000 | Strolle |
| 6,229,792 B1 | 5/2001 | Anderson et al. |
| 6,230,326 B1 | 5/2001 | Unger et al. |
| 6,233,274 B1 | 5/2001 | Tsui et al. |
| 6,240,553 B1 | 5/2001 | Son et al. |
| 6,272,150 B1 | 8/2001 | Hrastar et al. |
| 6,278,730 B1 | 8/2001 | Tsui et al. |
| 6,308,286 B1 | 10/2001 | Richmond et al. |
| 6,310,909 B1 | 10/2001 | Jones |
| 6,321,384 B1 | 11/2001 | Eldering |
| 6,330,221 B1 | 12/2001 | Gomez |
| 6,334,219 B1 | 12/2001 | Hill et al. |
| 6,377,552 B1 | 4/2002 | Moran et al. |
| 6,385,773 B1 | 5/2002 | Schwartzman et al. |
| 6,389,068 B1 | 5/2002 | Smith et al. |
| 6,434,583 B1 | 8/2002 | Dapper et al. |
| 6,445,734 B1 | 9/2002 | Chen et al. |
| 6,456,597 B1 | 9/2002 | Bare |
| 6,459,703 B1 | 10/2002 | Grimwood et al. |
| 6,477,197 B1 | 11/2002 | Unger |
| 6,477,526 B2 | 11/2002 | Hayashi et al. |
| 6,480,469 B1 | 11/2002 | Moore et al. |
| 6,483,033 B1 | 11/2002 | Simoes et al. |
| 6,498,663 B1 | 12/2002 | Farhan et al. |
| 6,512,616 B1 | 1/2003 | Nishihara |
| 6,526,260 B1 | 2/2003 | Hick et al. |
| 6,546,557 B1 | 4/2003 | Ovadia |
| 6,556,239 B1 | 4/2003 | Al Araji et al. |
| 6,556,562 B1 | 4/2003 | Bhagavath et al. |
| 6,556,660 B1 | 4/2003 | Li et al. |
| 6,559,756 B2 | 5/2003 | Al Araji et al. |
| 6,563,868 B1 | 5/2003 | Zhang et al. |
| 6,570,394 B1 | 5/2003 | Williams |
| 6,570,913 B1 | 5/2003 | Chen |
| 6,574,797 B1 | 6/2003 | Naegeli et al. |
| 6,588,016 B1 | 7/2003 | Chen et al. |
| 6,606,351 B1 | 8/2003 | Dapper et al. |
| 6,611,795 B2 | 8/2003 | Cooper |
| 6,646,677 B2 | 11/2003 | Noro et al. |
| 6,662,135 B1 | 12/2003 | Burns et al. |
| 6,662,368 B1 | 12/2003 | Cloonan et al. |
| 6,671,334 B1 | 12/2003 | Kuntz et al. |
| 6,687,632 B1 | 2/2004 | Rittman |
| 6,690,655 B1 | 2/2004 | Miner et al. |
| 6,700,875 B1 | 3/2004 | Schroeder et al. |
| 6,700,927 B1 | 3/2004 | Esliger et al. |
| 6,711,134 B1 | 3/2004 | Wichelman et al. |
| 6,741,947 B1 | 5/2004 | Wichelman et al. |
| 6,748,551 B2 | 6/2004 | Furudate et al. |
| 6,757,253 B1 | 6/2004 | Cooper et al. |
| 6,772,388 B2 | 8/2004 | Cooper et al. |
| 6,772,437 B1 | 8/2004 | Cooper et al. |
| 6,816,463 B2 | 11/2004 | Cooper et al. |
| 6,839,829 B1 | 1/2005 | Daruwalla et al. |
| 6,853,932 B1 | 2/2005 | Wichelman et al. |
| 6,877,166 B1 | 4/2005 | Roeck et al. |
| 6,895,043 B1 | 5/2005 | Naegeli et al. |
| 6,895,594 B1 | 5/2005 | Simoes et al. |
| 6,906,526 B2 | 6/2005 | Hart et al. |
| 6,928,475 B2 | 8/2005 | Schenkel et al. |
| 6,944,881 B1 | 9/2005 | Vogel |
| 6,961,314 B1 | 11/2005 | Quigley et al. |
| 6,961,370 B2 | 11/2005 | Chappell |
| 6,967,994 B2 | 11/2005 | Boer et al. |
| 6,973,141 B1 | 12/2005 | Isaksen et al. |
| 6,985,437 B1 | 1/2006 | Vogel |
| 6,999,408 B1 | 2/2006 | Gomez |
| 7,002,899 B2 | 2/2006 | Azenkot et al. |
| 7,010,002 B2 | 3/2006 | Chow et al. |
| 7,017,176 B1 | 3/2006 | Lee et al. |
| 7,032,159 B2 | 4/2006 | Lusky et al. |
| 7,039,939 B1 | 5/2006 | Millet et al. |
| 7,050,419 B2 | 5/2006 | Azenkot et al. |
| 7,054,554 B1 | 5/2006 | McNamara et al. |
| 7,058,007 B1 | 6/2006 | Daruwalla et al. |
| 7,072,365 B1 | 7/2006 | Ansley |
| 7,079,457 B2 | 7/2006 | Wakabayashi et al. |
| 7,099,412 B2 | 8/2006 | Coffey |
| 7,099,580 B1 | 8/2006 | Bulbul |
| 7,139,283 B2 | 11/2006 | Quigley et al. |
| 7,142,609 B2 | 11/2006 | Terreault et al. |
| 7,152,025 B2 | 12/2006 | Lusky et al. |
| 7,158,542 B1 | 1/2007 | Zeng et al. |
| 7,164,694 B1 | 1/2007 | Nodoushani et al. |
| 7,177,324 B1 | 2/2007 | Choudhury et al. |
| 7,197,067 B2 | 3/2007 | Lusky et al. |
| 7,222,255 B1 | 5/2007 | Claessens et al. |
| 7,227,863 B1 | 6/2007 | Leung et al. |
| 7,242,862 B2 | 7/2007 | Saunders et al. |
| 7,246,368 B1 | 7/2007 | Millet et al. |
| 7,263,123 B2 | 8/2007 | Yousef |
| 7,274,735 B2 | 9/2007 | Lusky et al. |
| 7,315,573 B2 | 1/2008 | Lusky et al. |
| 7,315,967 B2 | 1/2008 | Azenko et al. |
| 7,400,677 B2 | 7/2008 | Jones |
| 7,421,276 B2 | 9/2008 | Steer et al. |
| 7,451,472 B2 | 11/2008 | Williams |
| 7,492,703 B2 | 2/2009 | Lusky et al. |
| 7,554,902 B2 | 6/2009 | Kim et al. |
| 7,573,884 B2 | 8/2009 | Klimker et al. |
| 7,573,935 B2 | 8/2009 | Min et al. |
| 7,584,298 B2 | 9/2009 | Klinker et al. |
| 7,616,654 B2 | 11/2009 | Moran et al. |
| 7,650,112 B2 | 1/2010 | Utsumi et al. |
| 7,672,310 B2 | 3/2010 | Cooper et al. |
| 7,684,315 B1 | 3/2010 | Beser |
| 7,684,341 B2 | 3/2010 | Howald |
| 7,693,042 B1 | 4/2010 | Wei |
| 7,716,712 B2 | 5/2010 | Booth et al. |
| 7,739,359 B1 | 6/2010 | Millet et al. |
| 7,742,697 B2 | 6/2010 | Cooper et al. |
| 7,742,771 B2 | 6/2010 | Thibeault |
| 7,764,231 B1 * | 7/2010 | Karr et al. .................. 342/457 |
| 7,778,314 B2 | 8/2010 | Wajcer et al. |
| 7,787,557 B2 | 8/2010 | Kim et al. |
| 7,792,183 B2 | 9/2010 | Massey et al. |
| 7,856,049 B2 | 12/2010 | Currivan et al. |
| 7,876,697 B2 | 1/2011 | Thompson et al. |
| 7,953,144 B2 | 5/2011 | Allen et al. |
| 7,970,010 B2 | 6/2011 | Denney et al. |
| 8,000,254 B2 | 8/2011 | Thompson et al. |
| 8,037,541 B2 | 10/2011 | Montague et al. |
| 8,040,915 B2 | 10/2011 | Cummings |
| 8,059,546 B2 | 11/2011 | Pai et al. |
| 8,081,674 B2 | 12/2011 | Thompson et al. |
| 8,116,360 B2 | 2/2012 | Thibeault |
| 8,265,559 B2 | 9/2012 | Cooper et al. |
| 8,284,828 B2 | 10/2012 | Cooper et al. |
| 8,345,557 B2 | 1/2013 | Thibeault et al. |
| 2001/0055319 A1 | 12/2001 | Quigley et al. |
| 2002/0038461 A1 | 3/2002 | White et al. |
| 2002/0044531 A1 | 4/2002 | Cooper et al. |
| 2002/0091970 A1 | 7/2002 | Furudate et al. |

(56) References Cited

U.S. PATENT DOCUMENTS

| | | |
|---|---|---|
| 2002/0116493 A1 | 8/2002 | Schenkel et al. |
| 2002/0154620 A1 | 10/2002 | Azenkot et al. |
| 2002/0168131 A1 | 11/2002 | Walter et al. |
| 2002/0181395 A1 | 12/2002 | Foster et al. |
| 2003/0028898 A1 | 2/2003 | Howald |
| 2003/0043732 A1 | 3/2003 | Walton et al. |
| 2003/0067883 A1 | 4/2003 | Azenkot et al. |
| 2003/0101463 A1 | 5/2003 | Greene et al. |
| 2003/0108052 A1 | 6/2003 | Inoue et al. |
| 2003/0120819 A1 | 6/2003 | Abramson et al. |
| 2003/0138250 A1 | 7/2003 | Glynn |
| 2003/0149991 A1 | 8/2003 | Reidhead et al. |
| 2003/0158940 A1 | 8/2003 | Leigh |
| 2003/0179768 A1 | 9/2003 | Lusky et al. |
| 2003/0179770 A1 | 9/2003 | Reznic et al. |
| 2003/0179821 A1 | 9/2003 | Lusky et al. |
| 2003/0181185 A1 | 9/2003 | Lusky et al. |
| 2003/0182664 A1 | 9/2003 | Lusky et al. |
| 2003/0185176 A1 | 10/2003 | Lusky et al. |
| 2003/0188254 A1 | 10/2003 | Lusky et al. |
| 2003/0200317 A1 | 10/2003 | Zeitak et al. |
| 2003/0212999 A1 | 11/2003 | Cai |
| 2004/0015765 A1 | 1/2004 | Cooper et al. |
| 2004/0042385 A1 | 3/2004 | Kim et al. |
| 2004/0047284 A1 | 3/2004 | Eidson |
| 2004/0052356 A1 | 3/2004 | McKinzie et al. |
| 2004/0062548 A1 | 4/2004 | Obeda et al. |
| 2004/0073937 A1 | 4/2004 | Williams |
| 2004/0096216 A1 | 5/2004 | Ito |
| 2004/0109661 A1 | 6/2004 | Bierman et al. |
| 2004/0139473 A1 | 7/2004 | Greene |
| 2004/0163129 A1 | 8/2004 | Chapman et al. |
| 2004/0181811 A1 | 9/2004 | Rakib |
| 2004/0208513 A1 | 10/2004 | Peddanarappagari et al. |
| 2004/0233234 A1 | 11/2004 | Chaudhry et al. |
| 2004/0233926 A1 | 11/2004 | Cummings |
| 2004/0248520 A1 | 12/2004 | Miyoshi |
| 2004/0261119 A1 | 12/2004 | Williams et al. |
| 2005/0010958 A1 | 1/2005 | Rakib et al. |
| 2005/0025145 A1 | 2/2005 | Rakib et al. |
| 2005/0034159 A1 | 2/2005 | Ophir et al. |
| 2005/0039103 A1 | 2/2005 | Azenko et al. |
| 2005/0058082 A1 | 3/2005 | Moran et al. |
| 2005/0064890 A1 | 3/2005 | Johan et al. |
| 2005/0097617 A1 | 5/2005 | Currivan et al. |
| 2005/0108763 A1 | 5/2005 | Baran et al. |
| 2005/0122996 A1 | 6/2005 | Azenkot et al. |
| 2005/0163088 A1 | 7/2005 | Yamano et al. |
| 2005/0175080 A1 | 8/2005 | Bouillett |
| 2005/0183130 A1 | 8/2005 | Sadja et al. |
| 2005/0198688 A1 | 9/2005 | Fong |
| 2005/0226161 A1 | 10/2005 | Jaworski |
| 2005/0281200 A1 | 12/2005 | Terreault |
| 2006/0013147 A1 | 1/2006 | Terpstra et al. |
| 2006/0121946 A1 | 6/2006 | Walton et al. |
| 2006/0250967 A1 | 11/2006 | Miller et al. |
| 2006/0262722 A1 | 11/2006 | Chapman et al. |
| 2007/0002752 A1 | 1/2007 | Thibeault et al. |
| 2007/0058542 A1 | 3/2007 | Thibeault |
| 2007/0076592 A1 | 4/2007 | Thibeault et al. |
| 2007/0076789 A1 | 4/2007 | Thibeault |
| 2007/0076790 A1 | 4/2007 | Thibeault et al. |
| 2007/0086328 A1 | 4/2007 | Kao et al. |
| 2007/0094691 A1 | 4/2007 | Gazdzinski |
| 2007/0097907 A1 | 5/2007 | Cummings |
| 2007/0133672 A1 | 6/2007 | Lee et al. |
| 2007/0143654 A1 | 6/2007 | Joyce et al. |
| 2007/0147489 A1 | 6/2007 | Sun et al. |
| 2007/0177526 A1 | 8/2007 | Siripunkaw et al. |
| 2007/0184835 A1 | 8/2007 | Bitran et al. |
| 2007/0189770 A1 | 8/2007 | Sucharczuk et al. |
| 2007/0206600 A1 | 9/2007 | Klimker et al. |
| 2007/0206625 A1 | 9/2007 | Maeda |
| 2007/0211618 A1 | 9/2007 | Cooper et al. |
| 2007/0223512 A1 | 9/2007 | Cooper et al. |
| 2007/0223920 A1 | 9/2007 | Moore et al. |
| 2007/0245177 A1 | 10/2007 | Cooper et al. |
| 2008/0056713 A1 | 3/2008 | Cooper et al. |
| 2008/0062888 A1 | 3/2008 | Lusky et al. |
| 2008/0075157 A1 | 3/2008 | Allen et al. |
| 2008/0101210 A1 | 5/2008 | Thompson et al. |
| 2008/0125984 A1 | 5/2008 | Skendzic et al. |
| 2008/0140823 A1 | 6/2008 | Thompson et al. |
| 2008/0193137 A1 | 8/2008 | Thompson et al. |
| 2008/0200129 A1 | 8/2008 | Cooper et al. |
| 2008/0242339 A1 | 10/2008 | Anderson |
| 2008/0250508 A1 | 10/2008 | Montague et al. |
| 2008/0274700 A1 | 11/2008 | Li |
| 2008/0291840 A1 | 11/2008 | Cooper et al. |
| 2009/0031384 A1 | 1/2009 | Brooks et al. |
| 2009/0103557 A1 | 4/2009 | Hong et al. |
| 2009/0103669 A1 | 4/2009 | Kolze et al. |
| 2009/0158096 A1 | 6/2009 | Ali et al. |
| 2009/0249421 A1 | 10/2009 | Liu et al. |
| 2010/0083356 A1 | 4/2010 | Steckley et al. |
| 2010/0095360 A1 | 4/2010 | Pavlovski et al. |
| 2010/0154017 A1 | 6/2010 | An et al. |
| 2010/0157824 A1 | 6/2010 | Thompson et al. |
| 2010/0158093 A1 | 6/2010 | Thompson et al. |
| 2010/0223650 A1 | 9/2010 | Millet et al. |
| 2010/0322390 A1* | 12/2010 | Bialk et al. .................. 379/32.04 |
| 2011/0026577 A1 | 2/2011 | Primo et al. |
| 2011/0030019 A1 | 2/2011 | Ulm et al. |
| 2011/0069745 A1 | 3/2011 | Thompson et al. |
| 2011/0110415 A1 | 5/2011 | Cooper et al. |
| 2011/0194418 A1 | 8/2011 | Wolcott et al. |
| 2011/0194597 A1 | 8/2011 | Wolcott et al. |
| 2011/0197071 A1 | 8/2011 | Wolcott et al. |
| 2011/0243214 A1 | 10/2011 | Wolcott et al. |
| 2012/0054312 A1 | 3/2012 | Salinger |
| 2012/0084416 A1 | 4/2012 | Thibeault et al. |
| 2012/0147751 A1 | 6/2012 | Ulm |
| 2013/0003565 A1* | 1/2013 | Gotwals et al. ............... 370/248 |

FOREIGN PATENT DOCUMENTS

| | | |
|---|---|---|
| EP | 1257089 A2 | 11/2002 |
| EP | 1341335 A2 | 9/2003 |
| JP | 55132161 A | 10/1980 |
| JP | 04208707 A | 7/1992 |
| JP | 6120896 A | 4/1994 |
| JP | 6177840 A | 6/1994 |
| JP | 09008738 A | 1/1997 |
| JP | 9162816 A | 6/1997 |
| JP | 10247893 A | 9/1998 |
| JP | 11230857 A | 8/1999 |
| JP | 2001044956 A | 2/2001 |
| JP | 2003530761 A | 10/2003 |
| JP | 2004172783 A | 6/2004 |
| JP | 2004343678 A | 12/2004 |
| WO | 0192901 A1 | 6/2001 |
| WO | 0233974 A1 | 4/2002 |
| WO | 0233980 A2 | 4/2002 |
| WO | 2004062124 A1 | 7/2004 |
| WO | 2008103262 A1 | 8/2008 |
| WO | 2009146426 A1 | 12/2009 |

OTHER PUBLICATIONS

"DOCSIS Best Practices and Guidelines: Proactive Network Maintenance Using Pre-Equalization", Cable Television Laboratories, Inc., Document ID# CM-GL-PNMP-V02-110623, Jun. 23, 2011.

"A Simple Algorithm for Fault Localization Using Naming Convention and Micro-reflection Signature," Invention Disclosure 60193, Cable Television Laboratories, Inc., Jun. 2008, p. 2.

"Data-Over-Cable Service Interface Specifications DOCSIS 3.0: MAC and Upper Layer Protocols Interface," CM-SP-MULPIv3.0-I16-110623, Cable Television Laboratories, Inc., Jun. 2011, section 8, pp. 242-266.

"Data-Over-Cable Service Interface Specifications DOCSIS® 3.0—MAC and Upper Layer Protocols Interface Specification," CM-SP-MULPIv3.0-I17-111117, Cable Television Laboratories, Inc., Nov. 17, 2011, pp. 770.

(56) References Cited

OTHER PUBLICATIONS

"Pre-Equalization Based Pro-active Network Maintenance Process Model for CMs Transmitting on Multiple Upstream Channels," Invention Disclosure 60203, Cable Television Laboratories, Inc., May 2009, pp. 2.

"Pre-Equalization based pro-active network maintenance process model", Invention Disclosure 60177, Cable Television Laboratories, Inc., Jun. 2008, pp. 2.

Campos, L. A., et al., "Pre-equalization based Pro-active Network Maintenance Methodology," Cable Television Laboratories, Inc., (presentation), 2012, pp. 32.

Howald, R., "Access Networks Solutions: Introduction to S-CDMA,"presentation to Society of Cable Telecommunications Engineers (SCTE) South Florida Chapter, Motorola, Inc., 2009, pp. 15.

Howald, R., "Upstream Snapshots & Indicators (2009)," Regional Samples, Presentation to Society of Cable Telecommunications Engineers (SCTE) South Florida Chapter, Jan. 2010, pp. 22.

Howald, R., et al., "Characterizing and Aligning the HFC Return Path for Successful DOCSIS 3.0 Rollouts," Society of Cable Telecommunications Engineers (SCTE) Cable Tee Expo, Oct. 2009, pp. 66.

Howald, R.,"DOCSIS 3.0 Upstream: Technology, RF Variables & Case Studies," Access Networks Solutions, 2009, presentation to Society of Cable Telecommunications Engineers (SCTE) South Florida Chapter, Jan. 2010, pp. 23.

Hranac, R., "Linear Distortions, Part 1," Communication Technology, Jul. 1, 2005, accessed at www.cable360.net/print/ct/operations/testing/15131.html, pp. 6.

Liu, X., and Bernstein, A., "Variable Bit Rate Video Services in DOCSIS 3.0 Networks," NCTA Technical Papers, 2008, pp. 12.

Motorola., "White Paper: Expanding Bandwidth Using Advanced Spectrum Management," Sep. 25, 2003, pp. 12.

Newton's Telecom Dictionary, Sep. 1995, Flatiron Publishing, 9th Edition, pp. 216 and 1023, definitions of "carrier to noise ratio" and "signal to noise ratio".

Patrick, M., and Joyce, G., "Delivering Economical IP Video over DOCSIS by Bypassing the M-CMTS with DIBA," SCTE 2007 Emerging Technologies, Topic Subject: Service Velocity & Next Generation Architectures: How Do We Get There?, 2007, pp. 17.

Popper, A., et al, "An Advanced Receiver with Interference Cancellation for Broadband Cable Networks," Juniper Networks, International Zurich Seminar on Broadband Communications Access 2002, pp. 23-1-23-6.

Popper, A., et al, "Ingress Noise Cancellation for the Upstream Channel in Broadband Cable Access Systems," Juniper Networks, IEEE International Conference on Communications 2002, vol. 3, pp. 1808-1812.

Qureshi, S. U. H., "Adaptive Equalization," IEEE, vol. 73, No. 9, Sep. 1985, pp. 1349-1387.

Ramakrishnan, S., "Scaling the DOCSIS Network for IPTV," Cisco Systems, Inc., SCTE Conference on Emerging Technologies and the NCTA Cable Show, 2009, pp. 19.

Shelke, Y. R., "Knowledge Based Topology Discovery and Geo-localization," Thesis, 2010, pp. 173.

Thompson, R., et al., "256-QAM for Upstream HFC," Spring Technical Forum Proceedings, 2010, pp. 142-152.

Thompson, R., et al., "256-QAM for Upstream HFD Part Two," SCTE Cable Tec Expo 2011, Technical Paper, pp. 22.

Thompson, R., et al., "Multiple Access Made Easy," SCTE Cable Tec Expo 2011, Technical Paper, pp. 23.

Thompson, R., et al., "Optimizing Upstream Throughput Using Equalization Coefficient Analysis," National Cable & Telecommunications Association (NCTA) Technical Papers, Apr. 2009, pp. 35.

Thompson, R., et al., "Practical Considerations for Migrating the Network Toward All-Digital," Society of Cable Telecommunications Engineers (SCTE) Cable-Tec Expo, Oct. 2009, pp. 22.

Thompson, R., et al., "64-QAM, 6.4MHz Upstream Deployment Challenges," SCTE Canadian Summit, Toronto, Canada, Technical Paper, Mar. 2011, pp. 25.

Volpe, B., and Miller, W., "Cable-Tec Expo 2011: Advanced Troubleshooting in a DOCSIS© 3.0 Plant," Nov. 14-17, 2011, pp. 17.

Wolcott, L., "Modem Signal Usage and Fault Isolation," U.S. Appl. No. 61/301,835, filed Feb. 5, 2010.

Zhao, F., et al., "Techniques for minimizing error propagation in decision feedback detectors for recording channels," IEEE Transactions on Magnetics, vol. 37, No. 1, Jan. 2001, pp. 12.

United States Patent and Trademark Office, Non-Final Rejection for U.S. Appl. No. 13/458,368 dated Mar. 6, 2013, 21 pages.

Patent Cooperation Treaty, International Search Report and Written Opinion of the International Searching Authority for International Application No. PCT/US2013/038225, Jul. 29, 2013, 11 pages.

Patent Cooperation Treaty, International Search Report and Written Opinion of the International Searching Authority for International Application No. PCT/US2013/038202, Jul. 29, 2013, 10 pages.

R. Hranac: "BER and MER fundamentals", CISCO, 2007, Retrieved from the Internet: URL:http://www.gcscte.org/presentations/2008/Ron.Hranc_presentation-BER%20+%20MER%20Fun.pdf, [retrieved on Jul. 3, 2013], all pages.

Patent Cooperation Treaty, International Search Report and Written Opinion of the International Searching Authority for International Application No. PCT/US2013/038220, Jul. 18, 2013, 12 pages.

United States Patent and Trademark Office, Final Rejection for U.S. Appl. No. 13/458,368 dated Oct. 18, 2013, 26 pages.

\* cited by examiner

FIG. 7

| ∨ACTIVE ALARMS | | | | | | REFRESH |
|---|---|---|---|---|---|---|
| GVISION ID | SEVERITY | SCAN DATE | IP ADDRESS | FIBER NODE | NUMBER AFFECTED | ALARM TYPE |
| 298061 | MINOR | 2012 MAR 9 08:02:31 | 172.16.5.112 | 6.108.111.119.101.108.108 | 13 | UPSTREAM REFLECTION |
| 297288 | MINOR | 2012 MAR 7 18:01:55 | 172.16.5.112 | 6.108.111.119.101.108.108 | 6 | UPSTREAM REFLECTION |
| 298086 | CRITICAL | 2012 MAR 9 08:02:31 | 172.16.5.112 | 6.108.111.119.101.108.108 | 1 | FEC |
| 298083 | CRITICAL | 2012 MAR 9 08:02:31 | 172.16.5.112 | 6.108.111.119.101.108.108 | 1 | FEC |
| 298089 | CRITICAL | 2012 MAR 9 08:02:31 | 172.16.5.112 | 6.108.111.119.101.108.108 | 7 | PROXIMITY CLUSTER |

— 64

∨FIBER NODE VIEW

| NAME |
|---|
| 172.16.5.112 |
| 4.70.78.45.65 |
| 6.108.111.119 |

— 52

∧CABLE MODEMS — NUMBER AFFECTED 28

| MAC ADDRESS | POWER STATUS | NOISE STATUS | UPSTREAM REFLECTION STATUS | DOWNSTREAM REFLECTION STATUS | FEC |
|---|---|---|---|---|---|
| 00 25 f2 59 ec 62 | NONE | NONE | MINOR | NONE | NONE |
| 00 18 c0 26 69 02 | NONE | NONE | MINOR | NONE | NONE |
| 00 25 f2 59 ec 4a | NONE | NONE | MINOR | NONE | NONE |
| 00 25 f2 59 ec 66 | NONE | NONE | MINOR | NONE | NONE |
| 00 23 74 f6 a4 11 | NONE | NONE | MINOR | NONE | CRITICAL |
| 00 25 f2 59 ec 56 | NONE | NONE | MINOR | NONE | NONE |
| 00 25 f2 59 ec 4d | NONE | NONE | MINOR | NONE | NONE |
| 00 25 f2 59 ec 60 | NONE | NONE | MINOR | NONE | CRITICAL |
| 00 23 74 f6 a5 76 | NONE | NONE | MINOR | NONE | NONE |
| 00 18 c0 26 96 ba | NONE | NONE | MINOR | NONE | NONE |
| 00 25 f2 59 ec 53 | NONE | NONE | MINOR | NONE | NONE |

∨MAP  [MAP | SATELLITE]

— 58

| | TYPE | NAME |
|---|---|---|
| ☑ | ○ | 6.108.111.119.101.108.108 |
| ☑ | ○ | 298089 |

∧CHANNEL VIEW
∧CARD VIEW
∧DEBUG                                    CLEAR

*FIG. 10*

FIG. 11

ESTIMATING PHYSICAL LOCATIONS OF NETWORK FAULTS

CROSS-REFERENCE TO RELATED APPLICATIONS

Related subject matter is disclosed in the following patent applications, which are commonly owned and co-pending with the present application, and the entire contents of which are hereby incorporated by reference: U.S. application Ser. No. 13/458,368 filed Apr. 27, 2012, entitled "NETWORK MONITORING WITH ESTIMATION OF NETWORK PATH TO NETWORK ELEMENT LOCATION"; U.S. application Ser. No. 13/458,435 filed Apr. 27, 2012, entitled "MAPPING A NETWORK FAULT"; and U.S. application Ser. No. 13/458,472 filed Apr. 27, 2012, entitled "ESTIMATING A SEVERITY LEVEL OF A NETWORK FAULT".

BACKGROUND

Program providers such as multiple system operators, television networks and stations, cable TV operators, satellite TV operators, studios, wireless service providers, and Internet broadcasters/service providers, among others, may require broadband communication systems to deliver programming and like content to consumers/subscribers over networks via digital or analog signals. Such networks and physical plants can be extensive and complex and are typically difficult for an operator to manage and monitor for faults, impairments, and like maintenance and other issues. For instance, the monitoring of network maintenance activities may particularly present problems to operators of extensive cable networks.

By way of example, a cable network may include a headend which is connected to several nodes that may provide access to IP or ISPN networks. The headend typically interfaces with a cable modem termination system (CMTS) which has several receivers with each receiver connecting to numerous nodes each of which connect to numerous network elements, such as modems, MTA (media terminal adaptors), set top boxes, terminal devices, customer premises equipment (CPE) or like devices of subscribers. For instance, a single receiver of the CMTS may connect to several hundred or more network elements. Cable modems may support data connection to the Internet and other computer networks via the cable network, and the cable networks provides bi-directional communication systems in which data can be sent downstream from the headend to a subscriber and upstream from a subscriber to the headend. The cable networks typically includes a variety of cables such as coaxial cables, optical fiber cables, or a Hybrid Fiber/Coaxial (HFC) cable system which interconnect the cable modems of subscribers to the headend in a tree and branch structure where terminal network elements (MTA, cable modem, set top box, etc.) reside on various optical nodes. The nodes may be combined and serviced by common components at the headend.

Typically, the process for tracking which terminal devices are attached to which optical node and the like is a manual process. For instance, as a new customer's services are first enabled, a network operator may identify the specific node or location of the user and enter this information manually into a customer management database. Information of such connections is valuable for resolving physical layer communications issues, performing periodic HFC plant maintenance, and planning future service expansions. However, when the data is inaccurate or incomplete, it can often lead to misdiagnosis of issues, excessive costs associated with maintenance, and prolonged new deployments. In addition, as communication traffic increases or new services are deployed, the need to understand loading of parts of the network becomes important, particularly if existing subscribers must be reallocated to different parts of nodes of the network.

Thus, as discussed above, any kind of topological network location requires the manual entry of information into a database. This can be a fairly time consuming and tedious task. In practice, cable service providers typically solely rely upon customer calls and manual technician analysis to locate issues in their network and physical plants.

BRIEF DESCRIPTION OF THE DRAWINGS

Various features of the embodiments described in the following detailed description can be more fully appreciated when considered with reference to the accompanying figures, wherein the same numbers refer to the same elements.

FIG. 7 is a view of a graphical user interface with a local geographic map showing a node location, terminal network elements, network path, and alarms in accordance with an embodiment.

FIG. 10 is a view of a graphical user interface similar to FIG. 9 and including a listing of alarms for the cable modems displayed on the map according to an embodiment.

FIG. 11 is a view of a graphical user interface similar to FIG. 10 and including a listing of a particular performance parameter (in this instance, downstream microreflections in dBs for absolute and delta values) for the cable modems displayed on the map and channels used thereby according to an embodiment.

DETAILED DESCRIPTION

Figure 1:
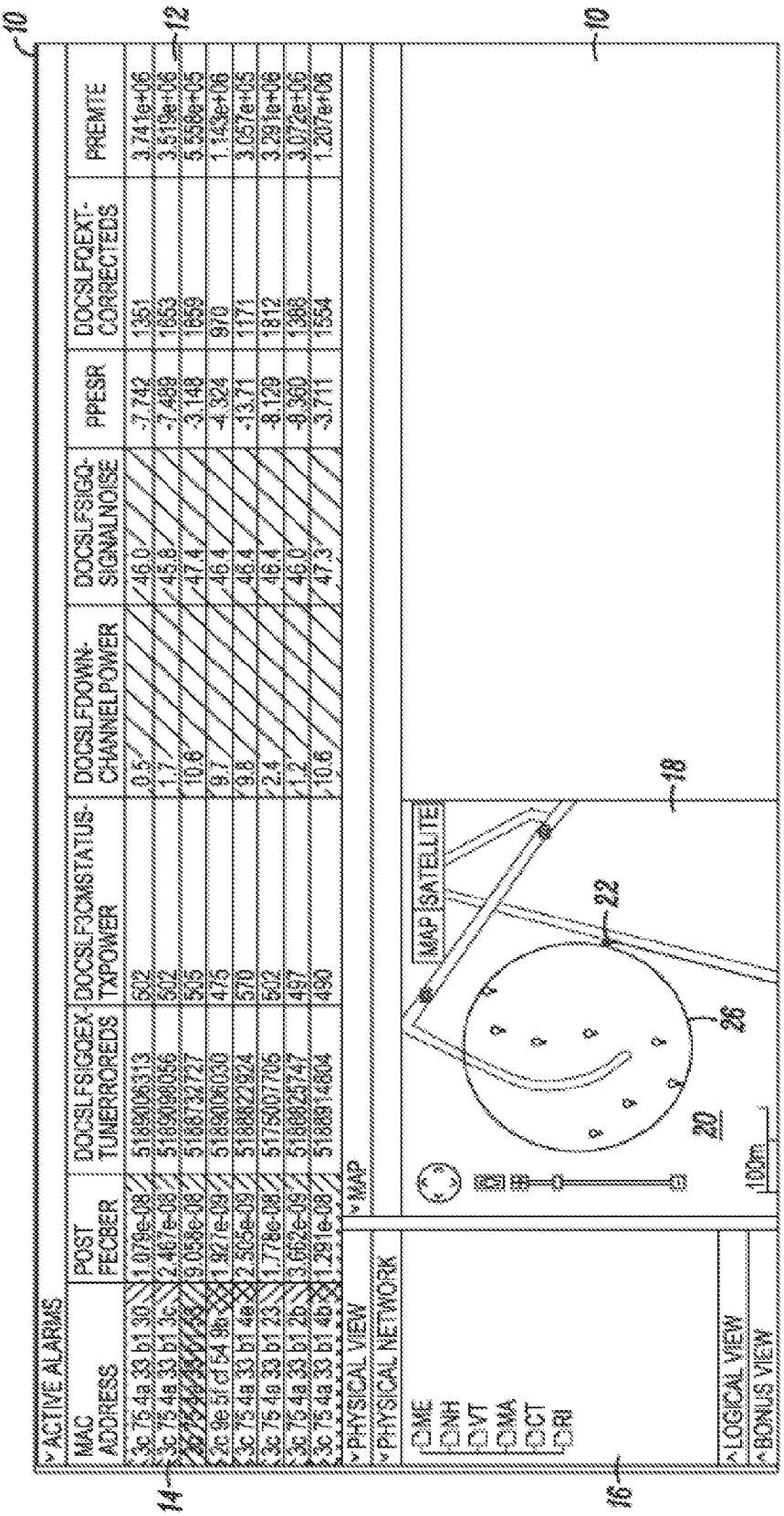
FIG. 1 is a snapshot screen view of a so-called dashboard of a graphical user interface according to an embodiment.

There exists a need for a management and/or monitoring system, tool and/or method that enables issues occurring in a network, such as a cable network, to be proactively and automatically located. For example, information concerning the geographical location of an issue, the nature of the issue, and/or the severity of an issue should provide useful information to a network operator if provided in a timely manner so that issues can be quickly detected, isolated, located and addressed. In addition, historical, long term, and periodic health information about a network may aid in determining trends that may indicate slow and steady degradation of a network element or component. Such degradation may not otherwise be detected based on spot checks until an actual failure occurs. If at least some of these tasks are accomplished automatically and if such a system or tool is able to scale across extremely large networks, this may permit network operators to become more proactive with network maintenance activities and to achieve higher levels of network availability and reliability. This may also enable operational costs to be reduced by decreasing the need for real time troubleshooting at a time after the occurrence of the problem or issue. Still further, the periodic collection and analysis of network conditions may provide a view into critical network indicators and aid in resolving issues prior to customer impact.

This disclosure describes a method of estimating a physical location of a network fault producing linear distortion or excessive loss impairments. Information is received electronically concerning the physical topology of the network by data pulls of information concerning network components and geographic locations of the network components and terminal network elements and geographic locations of the terminal network elements. A network fault is detected by automatically and electronically monitoring at least one performance parameter transmitted via upstream communications from the terminal network elements, and a physical location of a network fault on the network is automatically estimated based on the at least one performance parameter, the information of the physical topology of the network, and the terminal network element or elements from which the at least one performance parameter was received that indicated the network fault. A list of network components that require inspection and that may provide a source of the network fault is automatically generated.

This disclosure also describes a signal processing electronic device for populating a display of an interactive graphical user interface with a diagnostic alarm corresponding to a fault detected on the network. The device has at least one processing unit that is configured to receive information electronically of a physical topology of the network by data pulls of information concerning network components and geographic locations of the network components and terminal network elements and geographic locations of the terminal network elements. The at least one processing unit is also configured to detected a network fault by automatically and electronically monitoring at least one performance parameter transmitted via upstream communications from the terminal network elements and to automatically estimate a physical location of the network fault based on the at least one performance parameter, the information of the physical topology of the network, and the terminal network element or elements from which the at least one performance parameter was received that indicated the network fault. The at least one processing unit is further configured to automatically generate a list of network components that require inspection and that may provide a source of the network fault.

In addition, this disclosure describes at least one non-transitory computer readable storage medium having computer program instructions stored thereon that, when executed by at least one processor, cause the at least one processor to receive information electronically of a physical topology of a network by data pulls of information concerning network components and geographic locations of the network components and terminal network elements and geographic locations of the terminal network elements and to detect a network fault by automatically and electronically monitoring at least one performance parameter transmitted via upstream communications from the terminal network elements. In addition, a physical location of the network fault is estimated based on the at least one performance parameter, the information of the physical topology of the network, and the terminal network element or elements from which the at least one performance parameter was received that indicated the network fault, and a list of network components that require inspection and that may provide a source of the network fault is automatically generated.

For simplicity and illustrative purposes, the principles of embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

According to an embodiment, network monitoring is performed such that information concerning geographic location of monitored network elements, such as cable modems or the like, and associated network component topology, such as HFC components and the like, are automatically populated into a network management database or the like for purposes of providing a visual display, such as a geographically accurate street map or satellite image of a region of a service area, that can clearly indicate a fault or other issue and the geographical location thereof. Thus, the path that the network takes geographically is displayed on the map along with the physical location of network elements and components within the network. Such a map provides a useful network management tool to network operators and field technicians for resolving issues in an efficient and prompt manner.

As one contemplated example, the map can be provided as part of a graphical interface which displays faults of varying severity levels ranging from critical to completely non-service affecting. Accordingly, in at least some embodiments, the severity of a fault on the network is automatically determined and displayed with the estimated geographic location of the fault on the map.

In addition, the network monitoring and management system or tool can be provided and fully integrated into software that is loaded and resides on a server or remote server connected to or communicating with the network. Of course, the software may reside on other devices and equipment such as equipment located at the headend of the network, cloud devices, and portable or mobile devices. This approach eliminates the need for manual analysis of data and permits large amounts of data to be automatically analyzed electronically by microprocessors or the like on a large scale.

The network management tool or software may estimate and make assumptions regarding probable tap and passive locations and couple this information with Keyhole Markup Language (KML) geographical data and known optical node location data. From this cumulative information, the network management tool or software can estimate and automatically populate a map or the like of a given service area with monitored cable modem locations and associated network component topology.

The geographic location of a fault and surrounding network path can be estimated, isolated, and displayed despite minimum information and manually entered data concerning the actual network path or network element location being available. The graphical interface can identify and display specific network elements as problematic. As an example, a network or HFC component such as cables, taps, passives, or the like that is identified as a suspect component potentially contributing to linear distortion or excessive loss impairments may be identified and displayed as a location of a fault. Whether a fault impacts a single subscriber or a group of subscribers may also be estimated and shown in the display.

Still further, the network management tool may be used to identify clusters or groups of network elements or cable modems that may share network or HFC infrastructure, such as common components including optics, nodes, amps, cables, taps, passives, and the like. In this regard, Management Information Base (MIB) information for service groups readily available via data pulls from a CMTS or like equipment at the headend of the network can be used in conjunction with the above referenced geographical location information. Network element groups or clusters can be readily displayed via the graphical interface and without the need for the software to reference other sources, perform testing, or wait for common impairment signature alarms to be raised.

Still further, the severity of a fault may be estimated with respect to upstream impairments through association of physical layer metrics including pre and post forward error correction (FEC) along with the number of impacted network elements or subscribers. Higher priority alarms are assigned to groups of network elements or subscribers that exceed threshold values. In contrast, lower priority alarms can be assigned to faults detected for single network elements or subscribers.

According to an embodiment, the graphical interface referenced above may be presented in the form of a so-called "dashboard" to a user such as personnel of a network operations center. Critical alarms may be shown across the entire network in a geographical display of the network or parts thereof. In addition, access may be provided to statistics via use of the dashboard to allow the user to monitor the overall health of their network.

Figure 2:
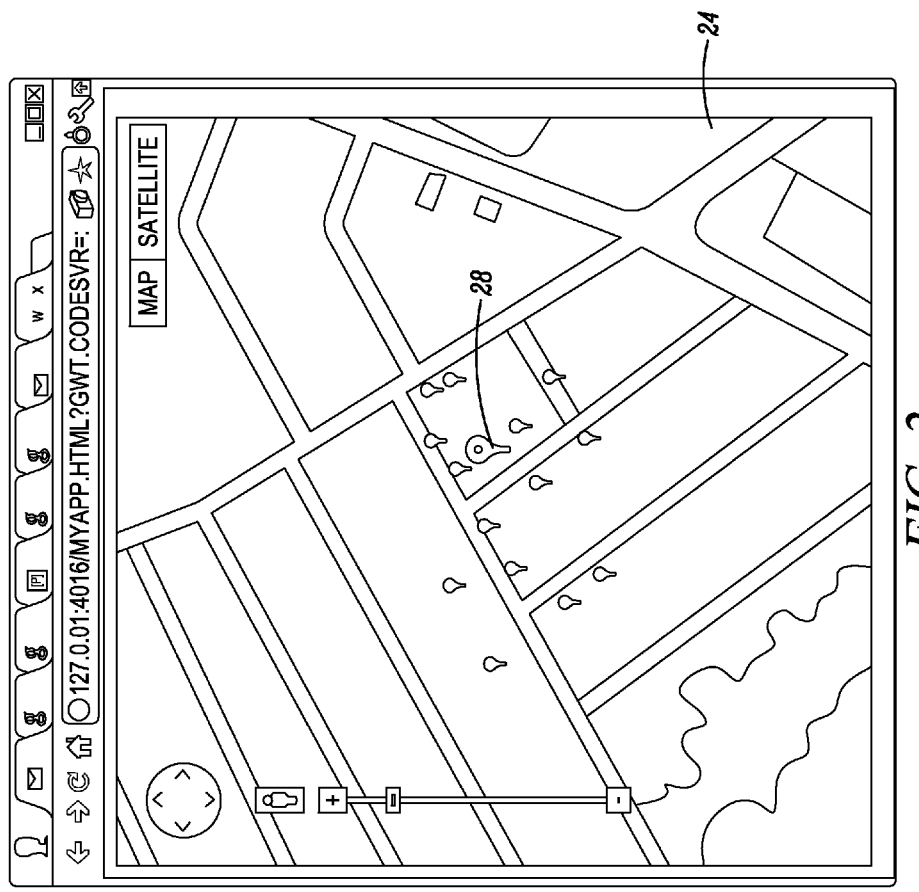
FIG. 2 is a view of a panel of the dashboard showing a cluster of objects displayed on top of a satellite image of a geographic area into which a network extends according to an embodiment.

Various snap-shot views of a graphical user interface are provided in FIGS. 1-14 and are discussed below. It should be understood that these displays may be altered as desired. A first example of a dashboard 10 which may be displayed to a user via a monitor or the like electronic display screen is shown in FIG. 1. In this example, a first panel 12 of the dashboard 10 provides information of "Active Alarms" including a list of alarms or potential faults 14, a second panel 16 provides a so-called "Physical View" of the network, and a third panel 18 provides a geographically-accurate street map 20 showing the geographical location of the alarms listed in panel 12 along with the nearest node 22 or other network component. The map 20 may include roads and streets and names thereof. In addition, as best illustrated in FIG. 2, alarms can be overlaid on images 24, for instance satellite images, of the geographical service area in which the alarms are located.

When an issue, fault or alarm is identified, it can be associated and displayed with other issues, faults and alarms based on geographical proximity. For instance, see the alarms 14 within circle 26 in FIG. 1. This group or cluster of alarms provides a visual indicator of the network elements affected and can indicated a center point of a potential problem causing the cluster of alarms. For instance, see the center point 28 in FIG. 2. A user which selects the center point may be provided with a listing of problem network elements or modems. In addition, the cluster of alarms may have a single corresponding "alarm" object to thereby reduce the number of alarms displayed to the user.

After an issue is first identified by the network monitoring and management system, tool or software, the operator or user may be provided with several options to further investigate the apparent problem or problems. For instance, network issues may be isolated by "serving group" or "geographic proximity" (i.e., clustering) and may be prioritized by severity based on the number of customers/subscribers affected and the extent to which faults are service-affecting. The network faults can be linked by the management software to a map interface which enables the fault to be connected to a physical location in the network.

FIGS. 3-11 provide further examples of views of a dashboard which may be displayed to a network operator. Any type or number of available charts, maps, or alert views can be viewed and organized in the dashboard. By way of example, the dashboard 30 shown in FIG. 3 may be configured as a starting point when a user first logs onto the network monitoring and management software or system. Here, a "zoomed-out" view of the network is initially provided to permit an overall view of the network, which may span a large geographic area. Data is collected and analyzed by the network monitoring and management tool to identify a type of fault or faults and the estimated geographic location of the fault(s) solely based on analysis of the data.

Figure 3:
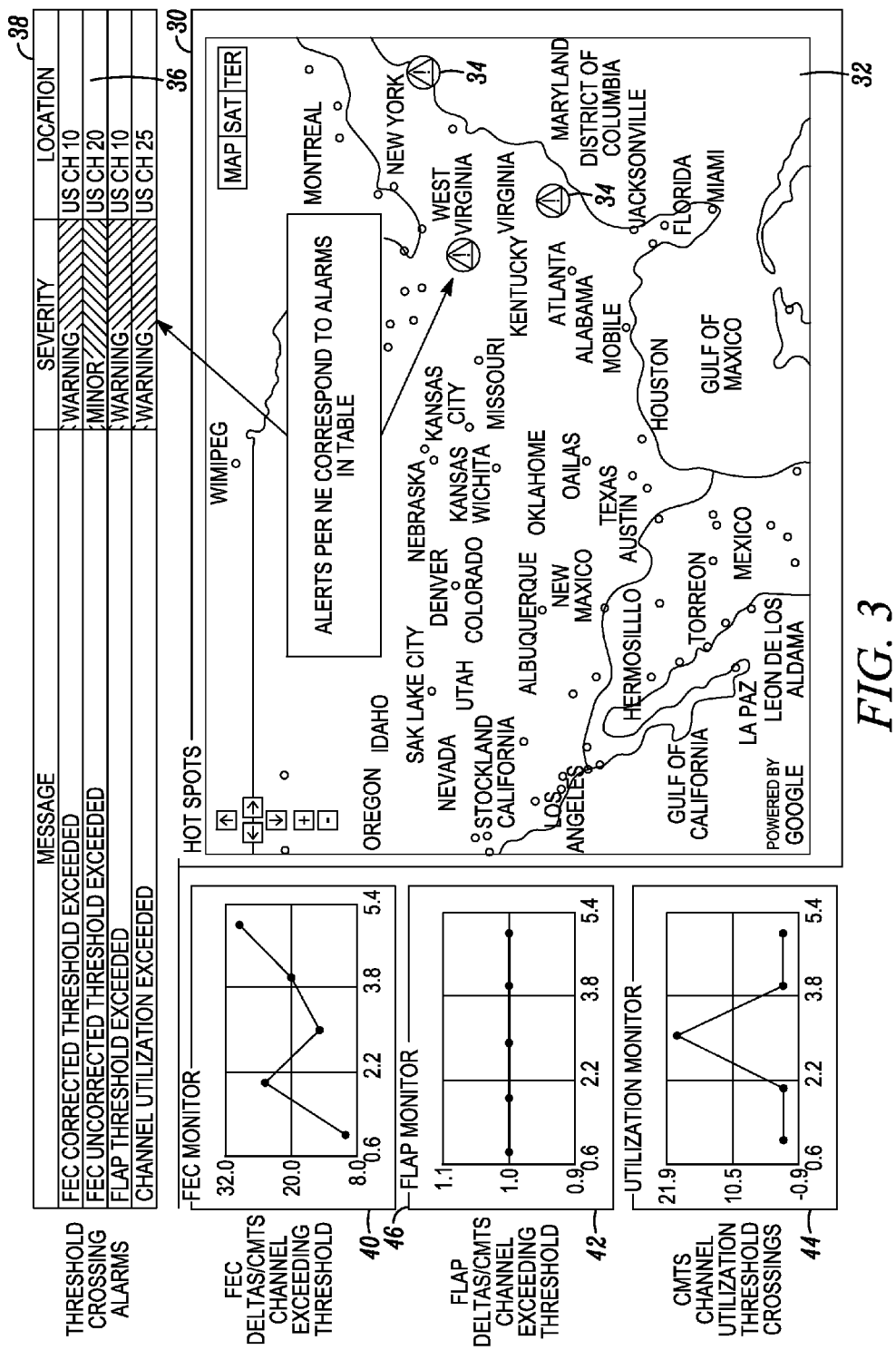
FIG. 3 is a view of an interactive user interface display which may provide a starting point of the dashboard once a user logs into the system according to an embodiment.
Figure 4:
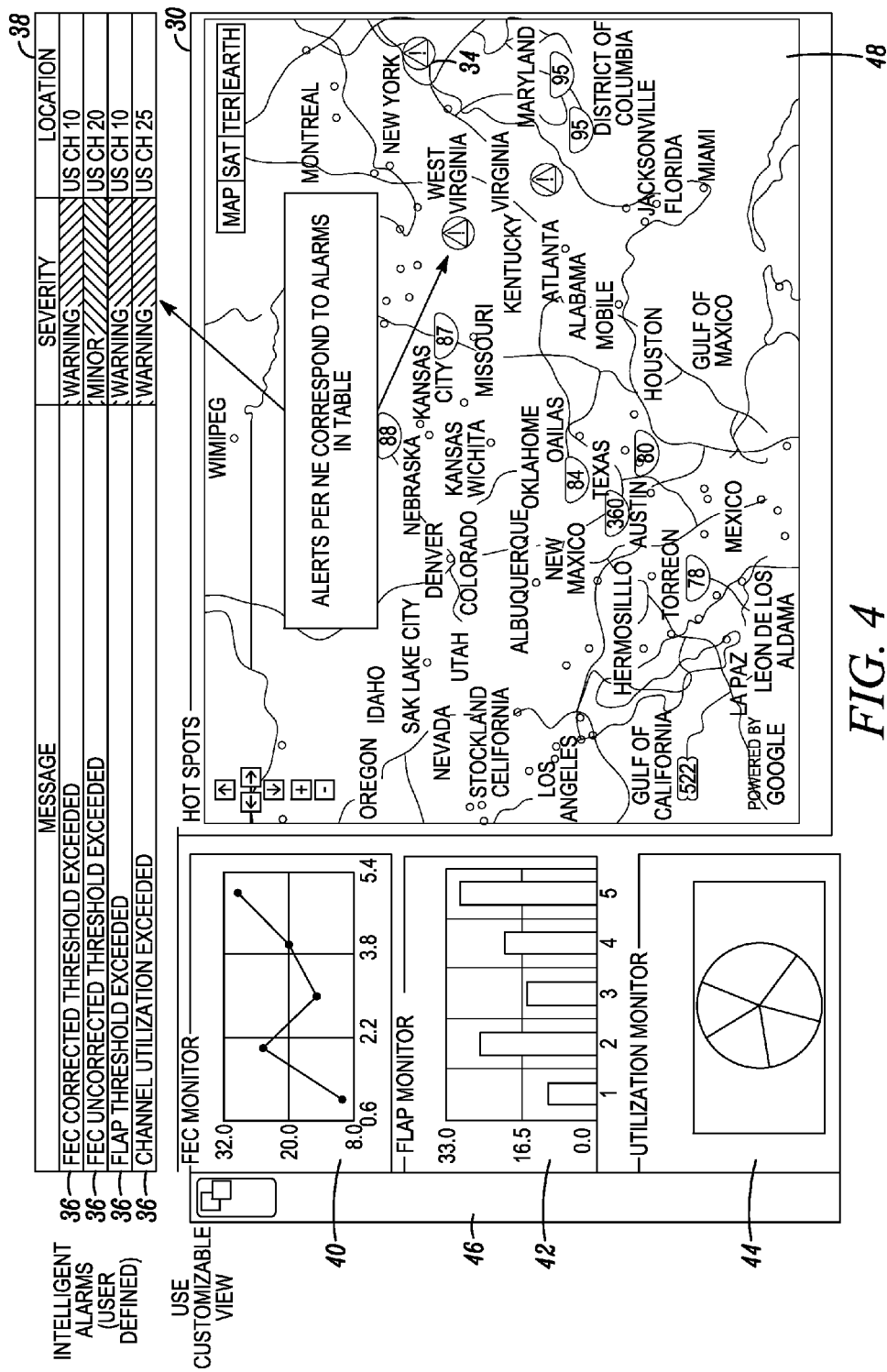
FIG. 4 is a view similar to FIG. 3 with the map further zoomed-in to a particular region of the network service area according to an embodiment.

FIG. 3 provides an entire network view 32 based on a geographic format and provides an indication of so-called "hot-spots" 34 of alarms. A listing 36 of alarms can be provided in a panel 38 which can also indicate the severity and location of the hot-spots 34. Charts such as a FEC deltas/CMTS channel exceeding threshold chart 40, a Flap deltas/CMTS channel exceeding threshold chart 42, and a CMTS channel utilization threshold crossing chart 44 can be displayed in a panel 46 and correspond to the alarms shown in the listing 36. Of course, these charts provide just a few examples of possible charts. A further example of such a dashboard is shown in FIG. 4 which provides a display of a section of the map 48 in greater detail.

Figure 5:
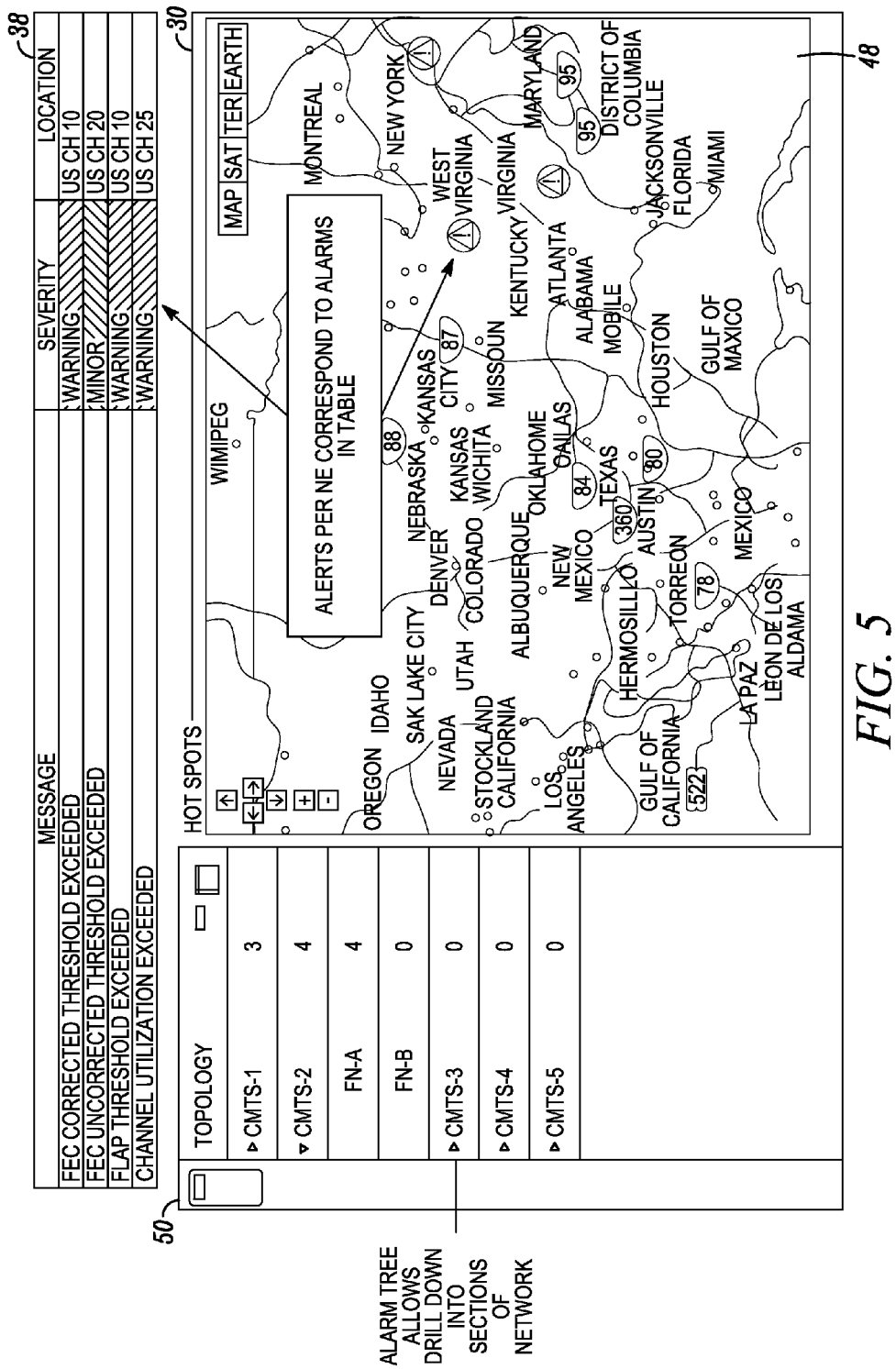
FIG. 5 is a view of an interactive user interface display which shows an alarm tree for use in investigating information of alarms shown on the display according to an embodiment.
Figure 6:
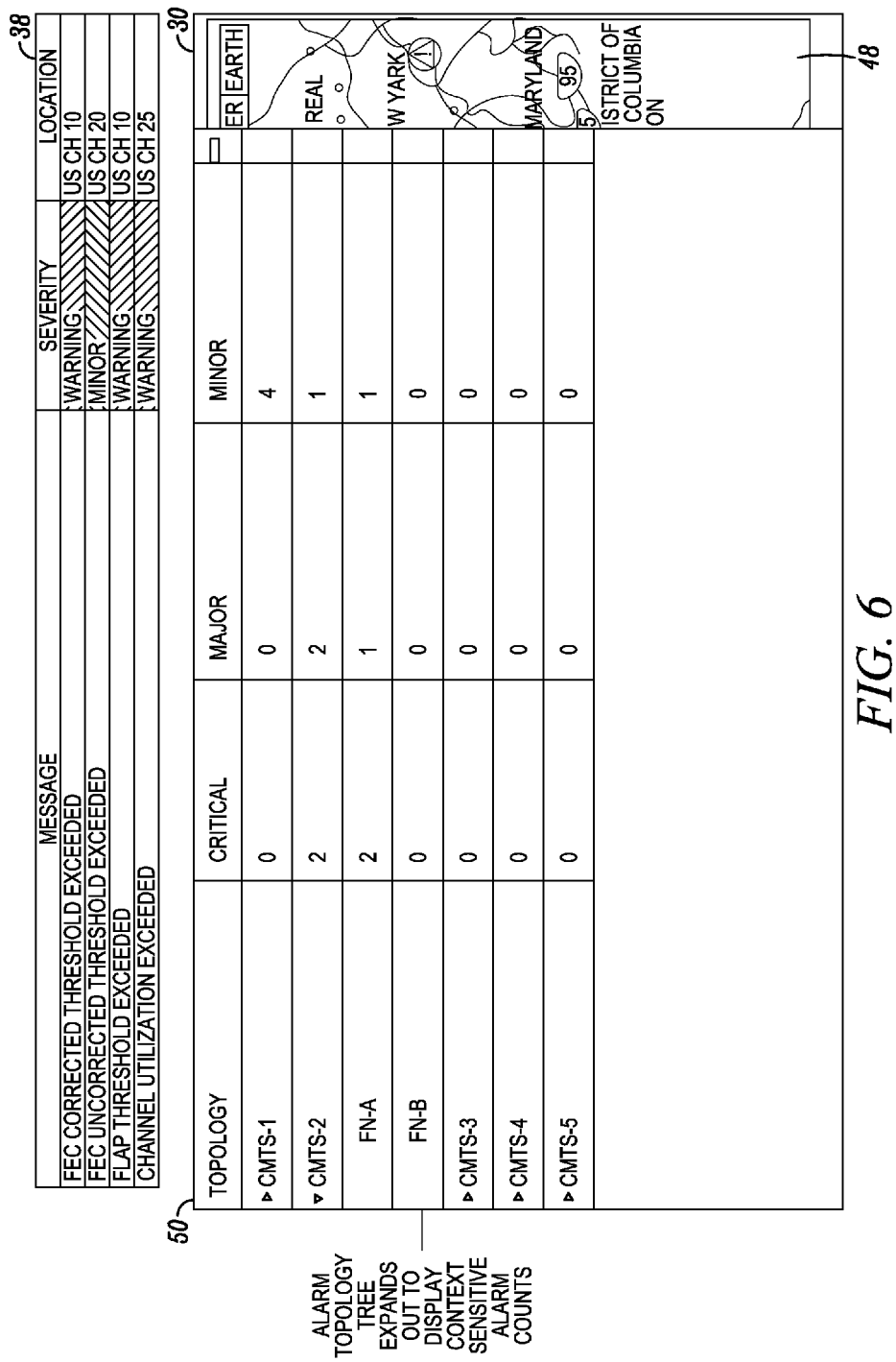
FIG. 6 is a view similar to FIG. 5 with the alarm tree further expanded in accordance with an embodiment.

In FIG. 5, a dashboard is shown in which panel 50 provides information on network topology. Here, the topology is provided in a form of a so-called alarm tree which enables a user to gain further information with respect to more narrowly defined sections of the network. For example, the topology could list CMTSs (such as CMTS-1, CMTS-2, CMTS-3, CMTS-4, and CMTS-5). Further, the fiber nodes (i.e., FN-A and FN-B) can be shown for any of the CMTSs and a number of network elements associated with an alarm can be listed. As shown in FIG. 6, the panel 50 can also be expanded to show the number of network elements associated with alarms per severity of alarm (i.e., critical, major, and minor).

Figure 7:
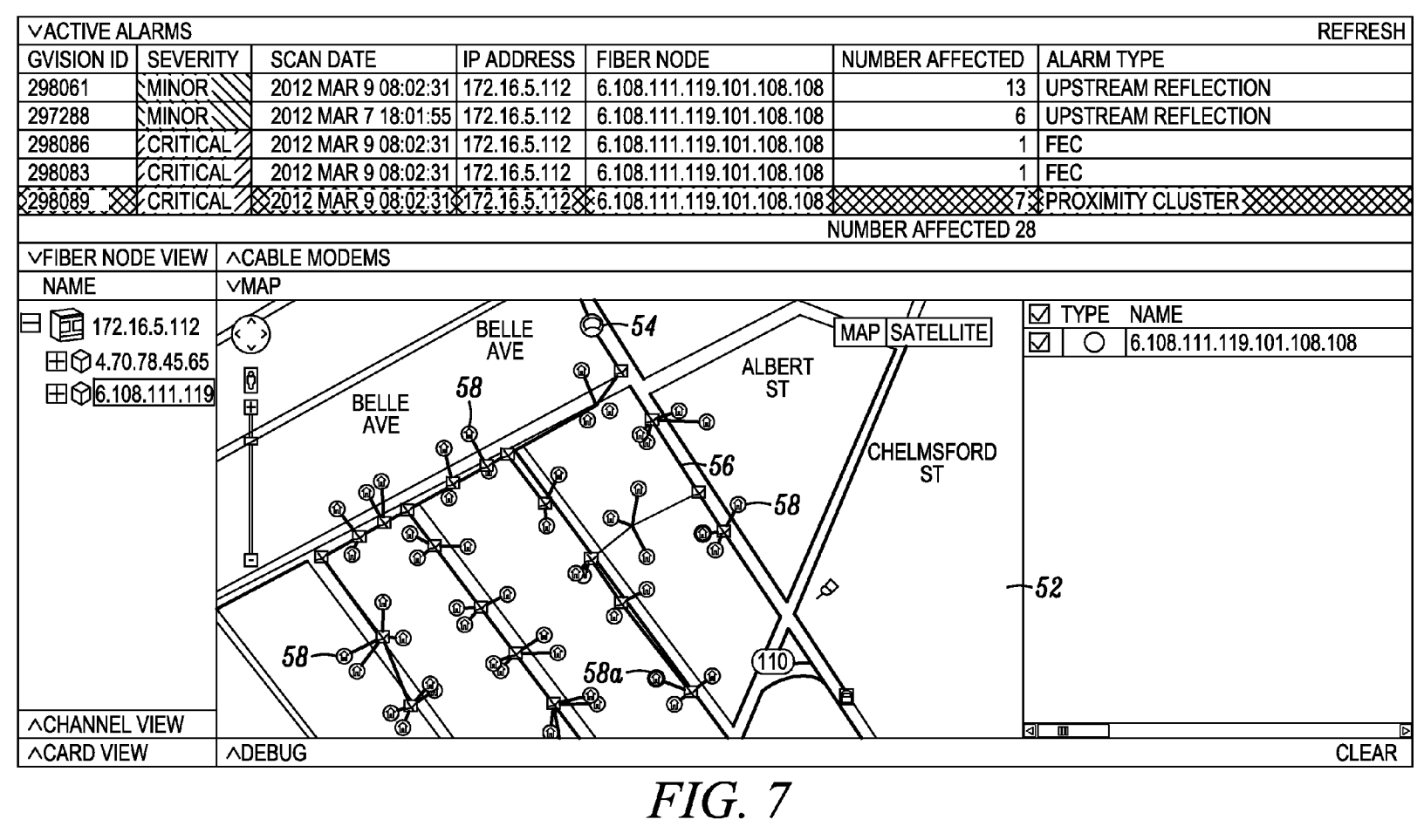
Figure 8:
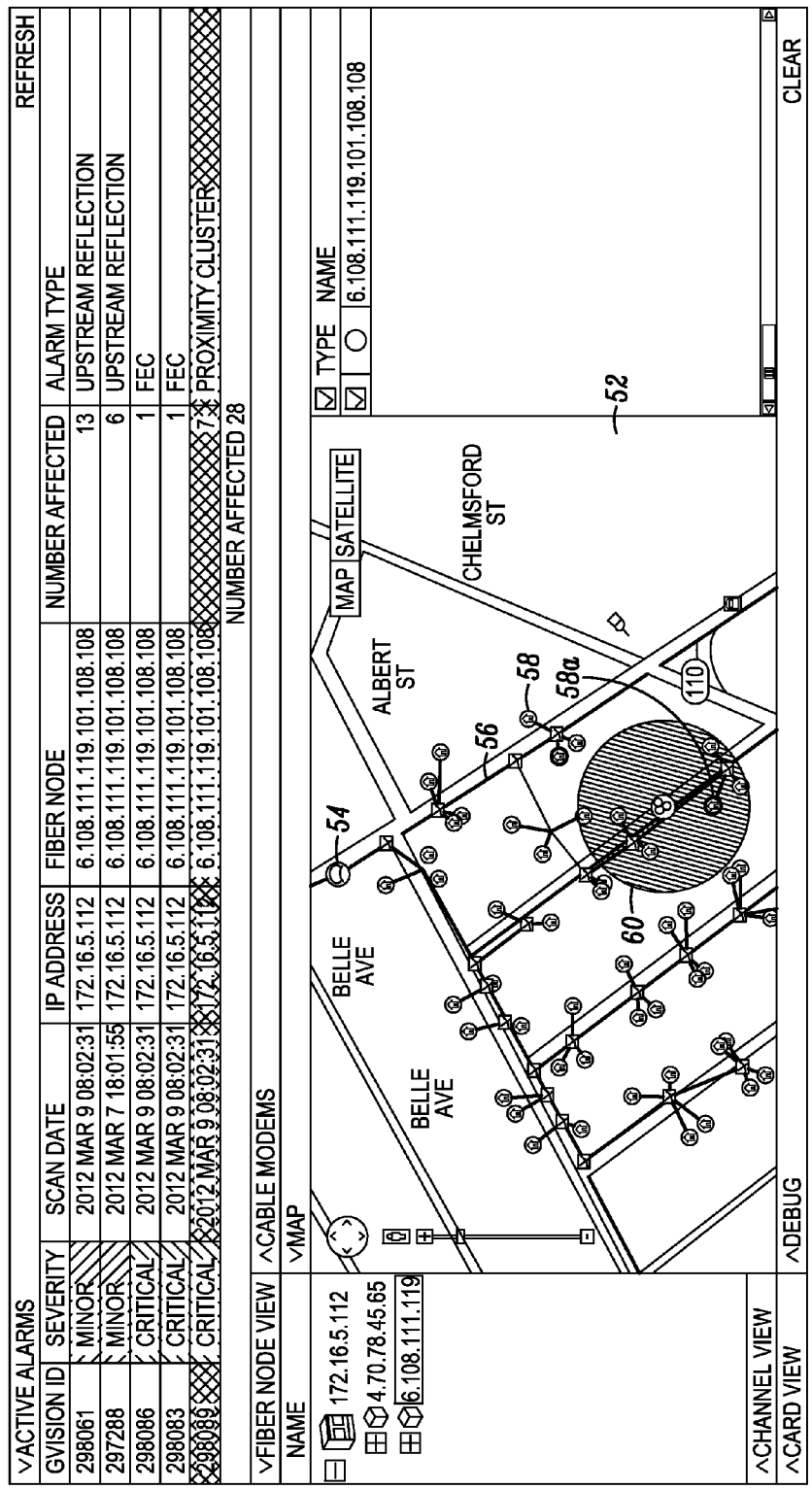
FIG. 8 is a view of a graphical user interface similar to FIG. 7 with a cluster of terminal network elements highlighted based on geo-proximity in accordance with an embodiment.

A more local view of a street map 52 is shown in FIG. 7. Here a single fiber node 54 of the network is shown as is the network path 56 extending from the node 54 to terminal network elements 58, such as cable modems, serviced via the node 54. The shade (or color, etc.) of the terminal networks elements 58 can be used to visually indicate an alarm on the map 52. For instance, terminal network element 58a is shown in a dark shade (or a particularly color, such as red) which may indicate an alarm of critical severity whereas terminal network elements displayed in lighter shades (other colors, such as yellow) may indicate an alarm of a minor severity. This same map 52 can be further investigated as shown in FIG. 8 in which a geo-proximity cluster 60 is shown highlighted. The path 56 of the cable plant shown in FIGS. 7 and 8 may be estimated using KML data as discussed in greater detail below. If desired, the user of the management tool is able to adjust the path 56 or enter in any known network topology information into the management software or tool should the estimated path and view be inaccurate.

Figure 9:
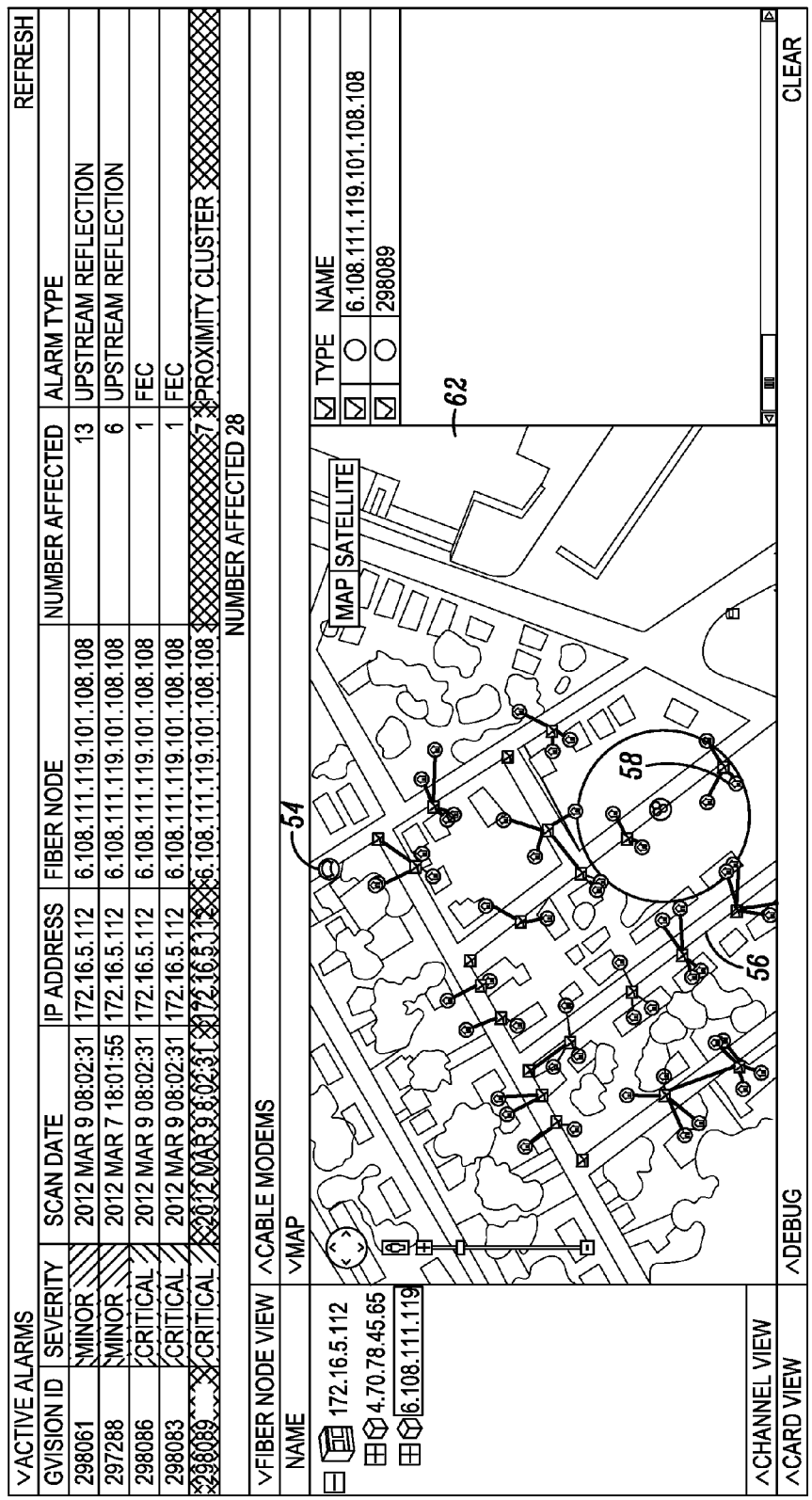
FIG. 9 is a view of a graphical user interface similar to FIG. 8 that is displayed on a satellite image of the geographic area according to an embodiment.
Figure 11:
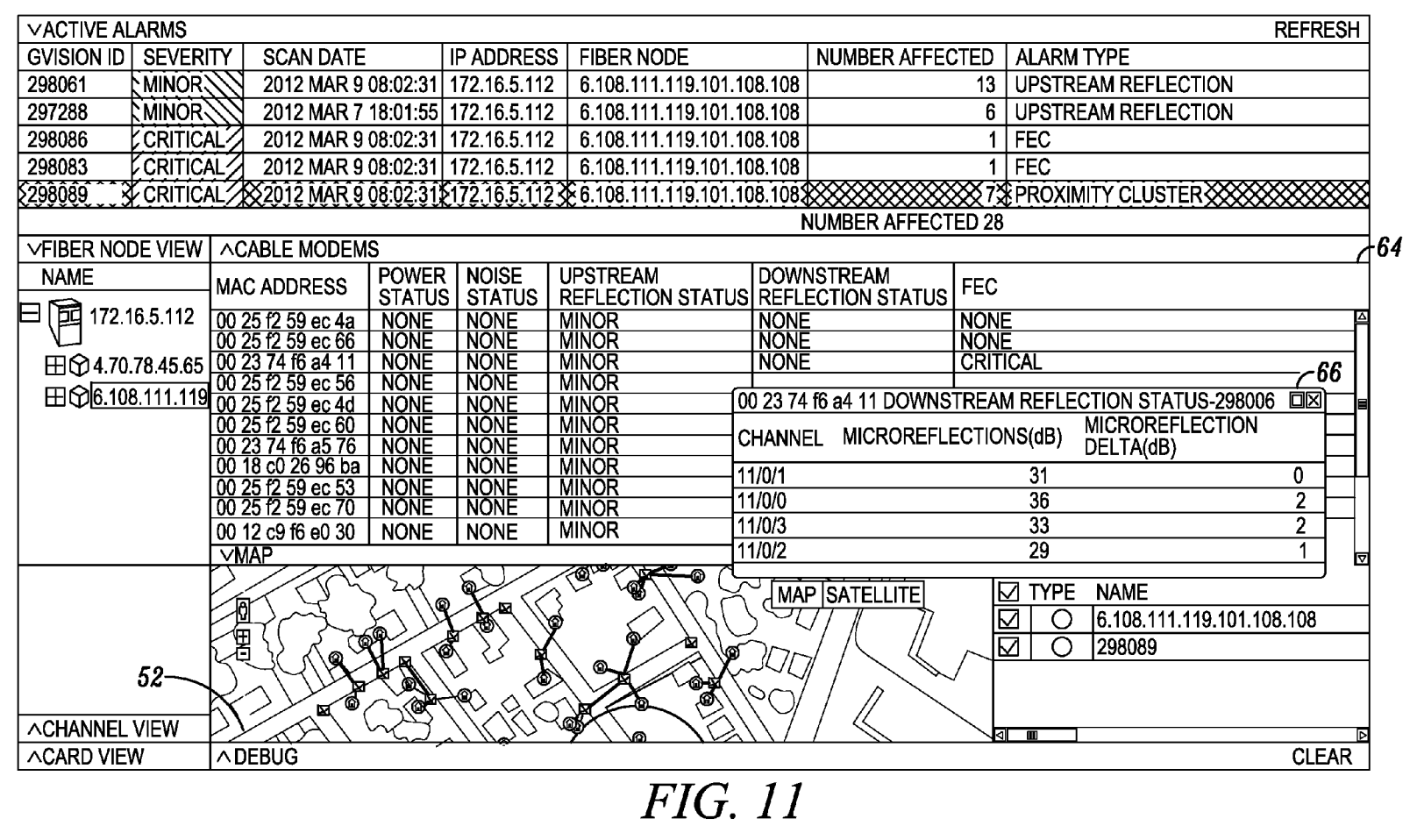

Another view similar to FIG. 7 is shown in the map 62 of FIG. 9. Here the street map 52 has been modified to show actual satellite imagery of the surrounding geographic area. The node 54, path 56, and terminal network elements 58 are overlaid on the satellite imagery as are the alarms and other network topology. For purposes of further investigating a potential network fault, the "cable modems" illustrated in FIG. 9 can be shown in a drop down window 64 such as shown in FIG. 10. Here the MAC address, power status, noise status, upstream reflection status, downstream reflection status, FEC status for each cable modem or terminal network element 58. Some of these cable modems and listed statuses have no alarms whereas others have alarms of "minor" severity while others have alarms of "critical" severity. FIG. 11 shows the ability of the tool to further investigate network issues. Here, measurements corresponding to downstream microreflections in dBs are listed (as absolute and delta values) are shown in a window 66 so that a user may view these or any other values that are or are not the subject of an alarm.

Accordingly, after a network operator center user views the above referenced dashboards and investigates alarms therewith, for instance as shown above, and has identified a particular issue that needs to be resolved, the network monitoring and management tool, software or system can be used to assist the user in sending an appropriate field technician to the correct geographical location. The user can also use the management tool or software to assess the urgency with respect to the need to resolve the issue.

The network monitoring and management system, tool or software can also be used by a service technician in the field. For example, the network monitoring and management software may be run on a remote server that is accessible by the technician such as via a secure wireless web interface. For instance, a mobile device, such as a portable, lap-top, notebook, or tablet computer, a smart phone, or the like may be used to obtain various views, information and maps as discussed above. Accordingly, provided information can be used for rapid, real-time debugging of field issues and provide geographic information, provide real-time monitoring of upstream and downstream performance metrics and error states, and permit a technician to see the interdependency of multiple issues. The above can reduce the need for the technician to access the inside of residences, reduce the number of calls the technician needs to make to the head-end, and enable the technician to update network topology information while in the field. For purposes of this disclosure, "real-time" includes a level of responsiveness that is sufficiently fast to provide meaningful data that reflects current or recent network conditions as well as a level of responsiveness that tolerates a degree of lateness or built-in delay.

Figure 12:
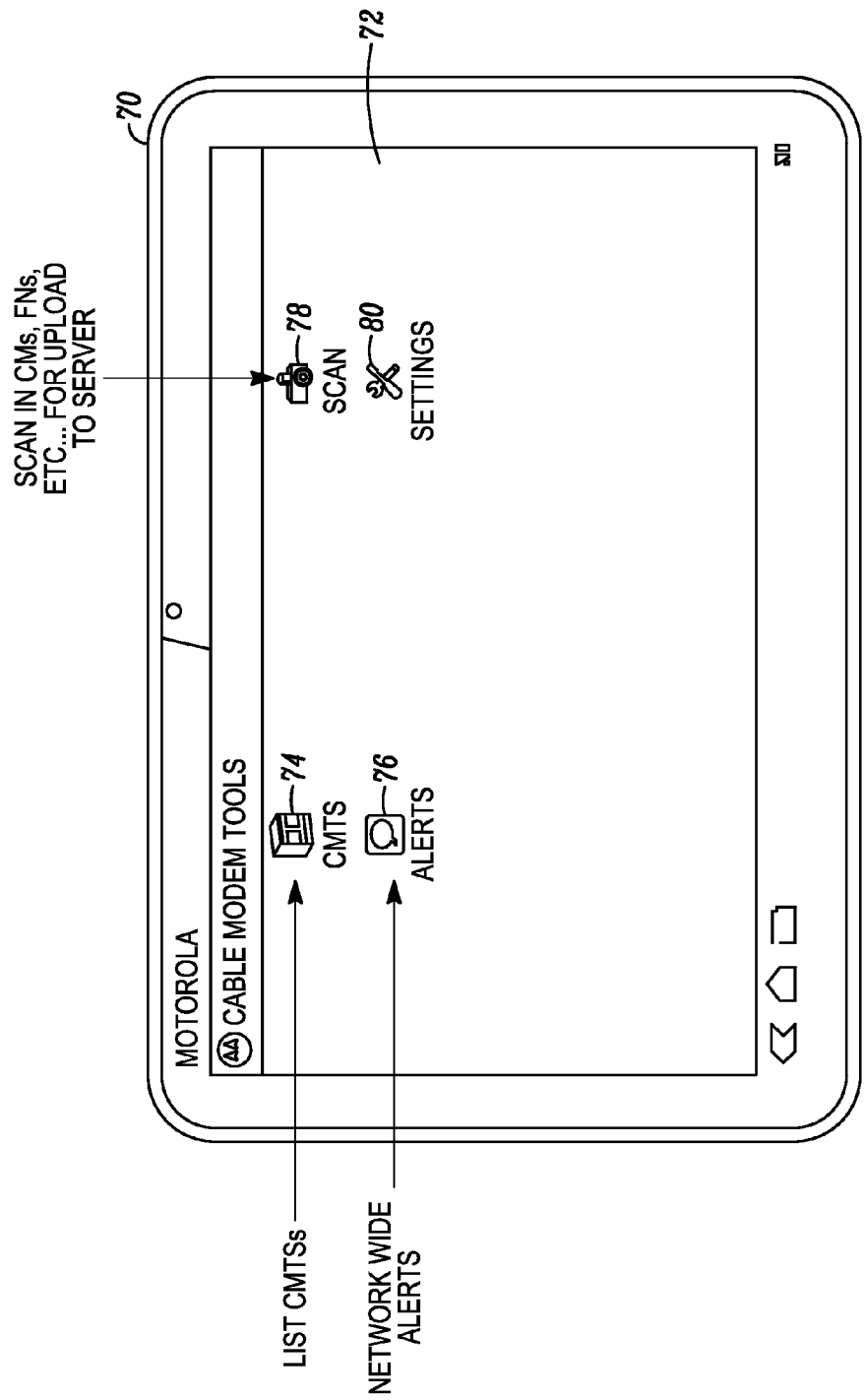
FIG. 12 is a view of a wireless communication tablet having a display screen that may be used by a field technician in accordance with an embodiment.
Figure 13:
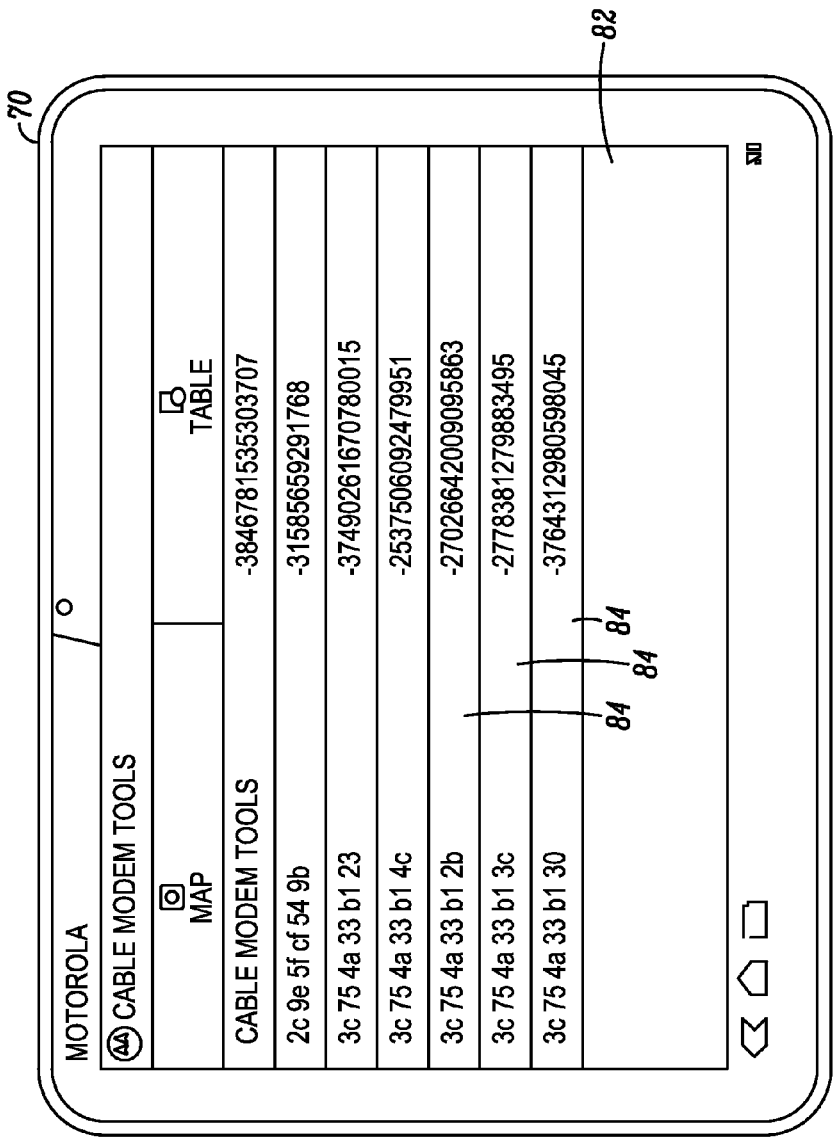
FIG. 13 is a snapshot view of a display screen of the tablet providing a list of faulted modems in accordance with an embodiment.
Figure 14:
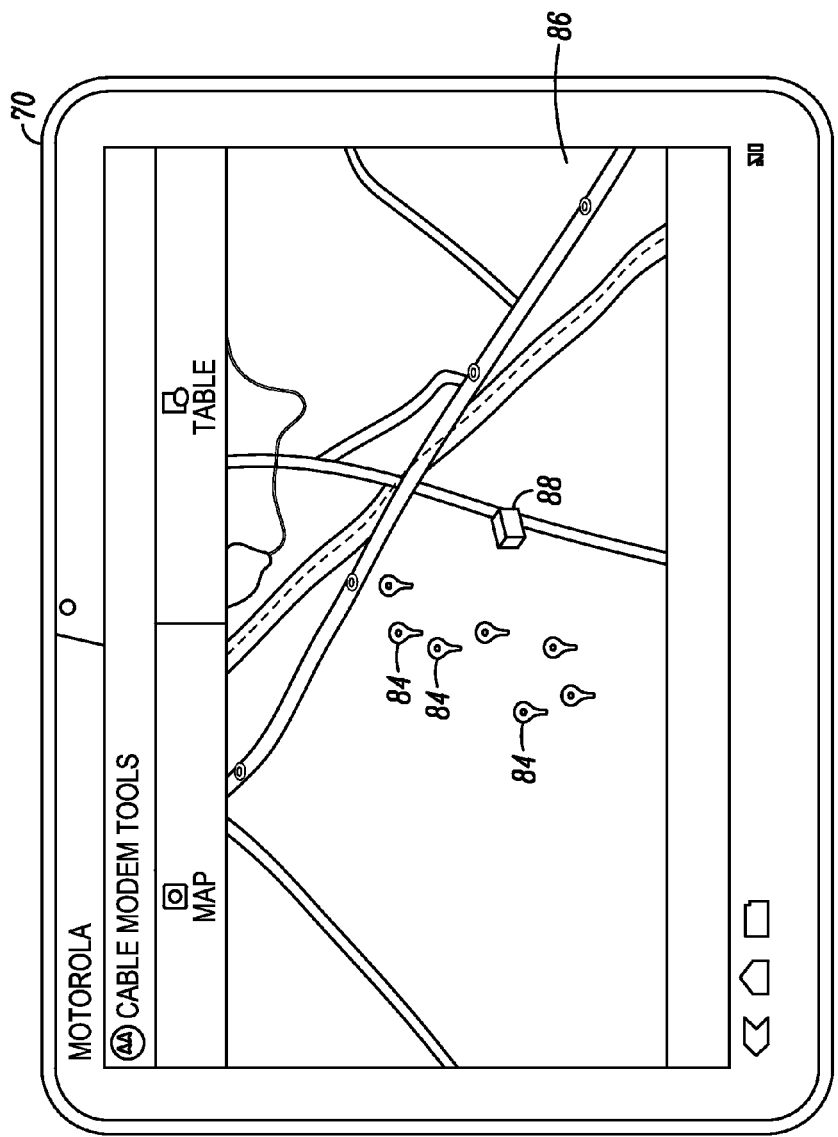
FIG. 14 is a snapshot view of a display screen of the tablet providing the geographic locations of the faulted modems on a street map in accordance with an embodiment.

By way of example, a tablet 70 is shown in FIGS. 12-14 that may be used by a field technician to connect to the network monitoring and management software. In FIG. 9, the technician is provided with a display 72 that includes an icon 74 for a list of the CMTSs, an icon 76 for network wide alerts, an icon 78 for scanning or uploading information into the system, and a settings icon 80. FIG. 10 shows a display 82 providing a tabular view of network devices 84 having faults, and FIG. 11 shows a display 86 showing the same network devices 84 in a geographical map-style platform with the closest fiber node 88 or like network component. All of the above provides helpful and useful information to the field technician.

Various methods are used by the network monitoring and management system, software, and tool described above that enables fault determination, fault location, mapping of the network geographically, displaying of faults with and without network topology information, displaying a cluster of network elements impacted by the same fault, and the severity of the fault. Embodiments of these methods are provided below.

Estimation of Network Path to Network Element Locations

Network operators seeking to implement a large scale network monitoring and management system are challenged by the need to enter all network topology information into a database for use by the network monitoring and management software. This manual data entry process can be extremely time consuming and expensive; however, if accomplished, such a database and information can provide extremely valuable information to the network operator.

An embodiment of the network monitoring and management system includes an automated process of approximating the path of a network. Thus, a manual task of entering and defining network path is not required, and the task of populating a database with such information is accomplished quickly with little or no manual effort. For this purpose, KML data can be used to estimate the path of a cable network, for instance, the path cabling of the network takes between a node (i.e., such as a fiber optic node) and a terminal network element (for instance, a cable modem). With this approach, slight errors in path estimation are tolerated, and the location estimation of network issues can be accurate.

Keyhole Markup Language (KML) is an Extensible Markup Language (XML) notation for expressing geographic annotation and visualization within Internet-based, two-dimensional maps and three-dimensional browsers. The KML file specifies a set of features (place marks, images, polygons, 3D models, textual descriptions, etc.) for display in any type of geospatial software implementing KML encoding. Each place or feature on the map is assigned a longitude and latitude. KML files may be distributed in KMZ files, which are zipped files with a ".kmz" extension. The contents of a KMZ file typically include a single root KML document (notionally "doc.kml") and optionally any overlays, images, icons, and 3D models referenced in the KML including network-linked KML files. By convention the root KML document is at root level and referenced files are in subdirectories (e.g. images for overlay images).

Accordingly, via the use of KML data, the physical locations of network faults and physical geographic location information of fiber nodes in the network can be displayed on a street map or satellite image. Fiber node information is typically stored by the network operator and would be readily available to the network monitoring and management software by importing such data via data pulls. Determination of network fault locations is discussed later in a separate section.

The method of mapping a network path can include estimating a geographic path of cables of a network between a geographic location of a network component and a geographic location of a terminal network element electronically using Keyhole Markup Language (KML) data of a surrounding geographic area (i.e., streets, etc.). Such a method can also include populating a geographically-accurate map with the geographic location of the network component, the geographic location of the terminal network element, and the estimated geographic path. The produced geographic map data may be displayed via geospatial software implementing KML encoding. During the estimating step, the KML data can be used to electronically determine a path corresponding to a shortest walking distance between the geographic location of the network component and the geographic location of the terminal network element, and the path corresponding to the shortest walking distance can be used as the geographic path of the cables of the network. A visual form of the geographic map can be displayed by a user with geospatial software implementing KML encoding in which the network component, the terminal network element, and the geographic path are graphically shown on the visual form of the geographic map. In addition, a geographic location of a suspected network fault can be added onto the geographic map for being graphically shown on the visual form of the geographic map.

Information can be electronically received concerning the network component and the geographic location of the network component. For example, the network component may be a fiber optic node and the information may be imported from a database via a cable modem termination system (CMTS).

Information can also be electronically received concerning the terminal network element and the geographic location of the terminal network element. For example, a service address of the terminal network element can be imported from a database, and the geographic location of the terminal network element on the geographic map can be marked as the geographic location of the service address. A location of a tap of the terminal network element can be defined as a location on a street in front of the service address. The location of a drop cable can be estimated as a connection between the geographic location of the service address and the estimated location of the tap. A path corresponding to a shortest walking direction from the network component to the terminal network element along streets included in the geographic map can be determined and used as the geographic path of the network between the network component and the tap.

The above path estimating procedure can be repeated automatically by the software for each terminal network element connected to the network component, and the numerous paths estimated can be overlaid to produce an overall estimated network path for a predetermined service area of the network.

A determination as to which cable modem is connected to which fiber node can be made, for instance, by either of the following alternatives. If information is readily available with respect to which network elements are in which DOCSIS serving groups, then a particular fiber node will be connected to the cable modems that are known to be within the same serving group assigned to the node. Alternatively, if this information is not readily accessible by the network monitoring and management software, then each cable modem is determined (estimated) to be connected to the fiber node to which it is physically closest (i.e., Manhattan distance).

With the above information displayed on a geographical map, points where paths intersect, but have not previously been marked as taps, can be identified as splitters. The only actual difference between a tap and a splitter is the power ratio of the outputs. In addition, points of network power level discontinuities observed relative to network architecture can be identified as locations of amplifiers.

With the above information, the network path and location of network elements and components can now be estimated and displayed by the network monitoring and management software. This software also provides the user with the ability to adjust the path and edit (add, delete or move) elements and components within the graphic display of the network and save them to the database as such information is verified by a field technician or the like. Thus, as more and more information is added into the database and saved, the accuracy of the results and future results can be further improved.

A signal processing electronic device, such as a server or remote server can run an application to provide the above process steps. In addition, a non-transitory computer readable storage medium having computer program instructions stored thereon that, when executed by a processor, cause the processor to perform the above discussed operations can also be provided.

In addition, various modifications can be implemented with the above described method. For example, corrections of the path estimation based on the curvature of the earth, summation of highly segmented paths into a single path, and removal of redundant data for scalability can be implemented to refine the estimated path or provide a desired view to the user.

Clustering Network Elements at Network Fault Locations

Customers/subscribers and their network elements must be linked to points on a map for purposes of being able to connect faults with a proper geographic location on the map. In some instances, there may be only a minimum amount of network element location data available to be accessed and automatically imported by the network monitoring system. When a minimum amount of information can be provided, the following process can be used to geographically locate issues within the network and prioritize the faults in order of severity.

The billing/service address associated with the Media Access Control (MAC) address on the cable modem/network element can be obtained and combined with information concerning DOCSIS serving groups to properly group cable modems together. When a fault is believed to affect such a group of modems, the numerous faults or alarms associated with each individual modem can be combined and prioritized into a single, higher priority, network fault.

For example, the customer's billing/service address is linked to the MAC address of the cable modem. This address is positioned on a map to identify the physical location of this particular cable modem. The MAC addresses are linked to the DOCSIS serving group to group modems in physical groups that will likely share the same network components. Thus, when a fault occurs in the network, the network monitoring and management system searches for groups of modems which are located near each other physically and share the same DOCSIS serving group. These groups are identified as a "Cluster". Any fault affecting the cluster can be identified as a single higher priority fault, as compared to being identified as a large number of individual and unrelated low priority faults.

Thus, according to an embodiment, a method of mapping a network fault includes the steps of receiving information electronically concerning geographical coordinates of terminal network elements on a network and an association of the terminal network elements with shared network components and monitoring a performance parameter transmitted over the network via upstream network communications from each one of the terminal network elements. Terminal network elements from which the performance parameter monitored is unacceptable relative to a predetermined threshold for the performance parameter are identified. A cluster of terminal network elements estimated to be subject to a common network fault is defined by including terminal network elements within the cluster that are: (i) identified as discussed above; (ii) within a predetermined geographic distance from each other as determined from the geographical coordinates obtained as discussed above; and (iii) are associated with a common shared network component of the network. The geographic coordinates corresponding to a center of the defined cluster and a radius of the defined cluster may also be estimated and indicated. A geographic map is then populated with a single cluster alarm for the network fault including an identification of the terminal network elements within the cluster. The geographic map may be displayable via geospatial software.

During the monitoring of performance parameters, different types of performance parameters may be monitored to identify different types of fault issues. Thus, during the step of defining a cluster, the terminal network elements included within the cluster may or may not be limited to terminal network elements subject to at least one selected type of the different types of fault issues.

For purposes of determining the set of terminal network elements on the network that are within a predetermined geographical proximity of the network fault, service addresses of terminal network elements on the network can be imported and used to determine whether or not terminal network elements are within the predetermined geographical proximity and to provide the geographic locations of the network elements to be populated on the geographic map. Since each terminal network element has a unique Media Access Control (MAC) address, the step of importing service addresses comprises the step of using known information of Media Access Control (MAC) addresses to link terminal network elements to the service addresses.

For purposes of determining which terminal network elements are within a common serving group, information can be imported concerning serving groups to which terminal network elements are linked and which terminal network elements are within a common serving group associated with the operation of the network component. By way of example, information concerning DOCSIS serving groups can be imported via data pulls from a cable modem termination system (CMTS) connected to the network. The data pulls from the CMTS can be from Management Information Base (MIB) information on the CMTS.

Information available with respect to Media Access Control (MAC) addresses of terminal network elements on the network can be used to link terminal network elements to the service addresses and to the common service group. The above described method can also include displaying a visual form of the geographic map with geospatial software in which the alarm or alarms, network component, and the cluster of terminal network elements are graphically shown on the visual form of the geographic map. Examples of shared network components can include a node, a fiber optic node, a passive optic splitter, a passive optic network unit, an amplifier, a tap, a cable, and the like. Still further, the method can further comprise a step of prioritizing the alarm associated with the network fault such that the network fault affecting the cluster is provided with a higher priority as shown on the geographic map than a different alarm for a network fault associated with a single terminal network element.

Figure 15:
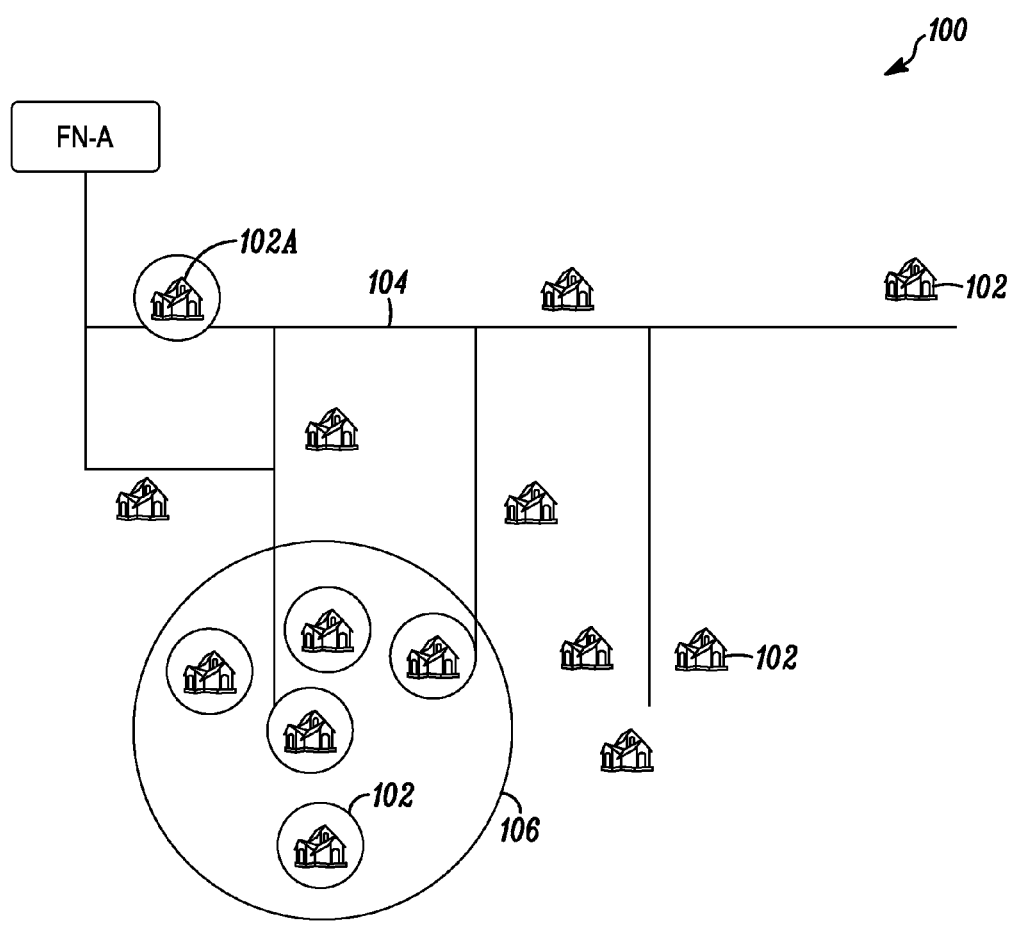
FIG. 15 is a view of a section of a network extending downstream from a node and in which a cluster of cable modems subject to a fault is defined in accordance with an embodiment.

FIG. 15 provides an example with respect to a general cluster threshold alarm. A portion of a network 100 extending downstream from fiber optic node FN-A is shown in FIG. 15. The illustration of each house 102 in FIG. 15 represents a location of a cable modem (not shown) connected to the network 100 and the lines 104 interconnecting the houses 102 and the node FN-A represent the network path. Performance parameters monitored from some of the cable modems may indicate at least some level of a network fault. In the Example shown in FIG. 15, the houses 102 individually circled are reporting issues. Five of the houses 102 located within the larger circle 106 are located near one another; whereas, the house 102A is located a greater distance away from the larger circle 106 shown in FIG. 15.

Based only on the geographic coordinates of each of the cable modems reporting an issue in FIG. 15 and their association with the common node component, FN-A, the cable modems within the larger circle 106 can be defined within a cluster subject to a single higher priority cluster alarm than the single cable modem at house 102A. The automatically generated cluster alarm can indicate the cable modems within the cluster (i.e., within circle 106), the node component FN-A, the geographic coordinates of the center of the defined cluster and the radius of the defined cluster. The definitions of clusters can include cable modems experiencing any type of issue or alarm or can be narrowed to cable modems experiencing a specific type of issue (i.e., a power related issue, a reflection related issue, a FEC related issue, etc.). Further, the definition of clusters can be limited based on the severity or level of the issue detected. In addition, a maximum distance between cable modems reporting issues can also be set to limit the possible size of a cluster. All the above settings and configurations can be instituted on a per node basis since network topologies may vary greatly from one node to the next of a network and since thresholds and alarm analysis may or may not be relevant for any particular node and across different regions of a large network.

A signal processing electronic device, such as a server or remote server, can run an application to provide the above process steps. In addition, a non-transitory computer readable storage medium having computer program instructions stored thereon that, when executed by a processor, cause the processor to perform the above discussed operations can also be provided.

Geographic Location/Isolation of
Faults/Impairments

A combination of monitored parameters and network topology information can be used to identify the likely physical locations of cable network defects. This approach is able to be implemented in software through straightforward numerical analysis. Complex image recognition and artificial intelligence are not required. In addition, a combination of sub-algorithms can be used to locate a common network failure point even when several different and potentially, seemingly unrelated, issues are observed.

A method of estimating the physical location of a network fault which is producing linear distortion or excessive loss impairments may include the step of receiving information electronically of a physical topology of a network. This may include data pulls of information concerning network components and geographic locations of the network components and terminal network elements and geographic locations of the terminal network elements. The method may also include the steps of detecting a network fault by automatically and electronically monitoring at least one performance parameter transmitted via upstream communications from terminal network elements on the network and automatically estimating a physical location of the network fault on the network based on the at least one performance parameter detected, the information of the physical topology of the network obtained, and the terminal network element or elements from which the at least one performance parameter was received that indicated the network fault. Thereafter, the method includes automatically generating a list of network components that may require inspection and may provide a source of the network fault. By way of example, the network components may include drop cables, taps, trunk cables, amplifiers, and node components.

The network may be a hybrid fiber-coaxial (HFC) network which interconnects the terminal network elements, such as cable modems, to a headend of the network having a cable modem termination system (CMTS) via a tree and branch network structure. The upstream communications are herein defined as communications transmitted in a direction from the terminal network elements toward the headend.

The method may also include the step of automatically and electronically populating a geographically-accurate map with a geographic location of a network component to which the network fault is attributed, a geographic location of each the terminal network elements impacted by the network fault, and a diagnostic alarm identifying the network fault. According to an embodiment, the map is displayable with the use of geospatial software.

A subset of monitored parameters is used to determine which elements in the physical network are potential points of fault. The monitored parameters can include, for instance: downstream power level (absolute and delta); upstream power level (absolute and delta); microreflections; upstream filter coefficient ratio; carrier-to-noise ratio (CNR)/signal-to-noise ratio (SNR); and modulation error ratio (MER).

According to one example, the upstream filter coefficient ratio, which can also be referred to as an Equalization Power Ratio (EPR), can be used in detecting the presence of faults in a cable network. The equation for this ratio is a 10 log of the ratio between tap energy used for correction divided by the total energy (including the main tap) of the equalizer of the cable modem. Thus, the equation may read: $EPR = 10*\log(TCE/TE)$; where TCE stands for Tap Correction Energy (i.e., the sum of the energy used by the equalizer in all of the taps, except the main tap) and TE stands for Total Energy (i.e., the sum of all of the energy used by the equalizer in all of the taps, including the main tap). Thus, with this particular parameter, the presence of a fault on the network is detected based on a determination of how much energy is needed by a cable modem for equalization correction of upstream communications. For example, after a certain level of correction is required, this is used as a tool for the indication of a potentially faulty component on the network.

After a fault is detected and relevant network topology is obtained, the following algorithms may be used to estimate the physical location of a fault. For example, if only a single cable modem within a common serving group of modems sharing common network components reports an unacceptable drop in downstream and upstream power level, then it is automatically estimated that the likely network elements which are causing the issue are the drop cable of the single cable modem, the associated tap, and the trunk cable feeding the tap. However, if multiple cable modems in the same serving group report this drop in power level, the drop cables, associated taps, and trunk cables feeding these taps are all identified as likely causes of the issue. However, the elements furthest upstream within the network topology are prioritized as the most likely location of a common defect in the network in this case.

If only a single cable modem within a common serving group of cable modems reports an unacceptable level of microreflections or in its upstream filter coefficient ratio (i.e., EPR as discussed above), or if there is an unacceptable drop in either of these parameters and an absolute power level value that is marginal, then it is estimated that the likely network elements which are causing the issue are the drop cable, the associated tap, and the trunk cable feeding the tap. If multiple cable modems in the same serving group report an unacceptable level of microreflections or in their upstream filter coefficient ratios, or if there is an unacceptable drop in either of these parameters and an absolute value that is marginal, then the drop cables, associated taps, and trunk cables feeding these taps are all identified as likely causes of the issue. However, the network elements which are most frequently identified in common are prioritized as the most likely location of a common defect in the network.

If multiple cable modems within the serving group are showing both reflection and power drop issues, both sets of elements are identified as potential causes. However, the power defect result is prioritized even if the true issue is reflection based. This is because the power defect result will more likely identify the correct point in the network to address to solve the issue.

If a power drop issue is observed on only the upstream or downstream signal, then prioritization is placed upon amplifier and node elements.

If one or more cable modems are showing unacceptable levels of CNR/SNR or MER and are showing acceptable power levels, then priority is placed on the amplifier and node elements within the system. However, if one or more cable modems are showing unacceptable levels of CNR/SNR or MER and are showing unacceptable power levels, then priority is placed on the power level fault identification as discussed above (i.e., drop cable, the associated tap, and the trunk cable feeding the tap).

Figure 16:
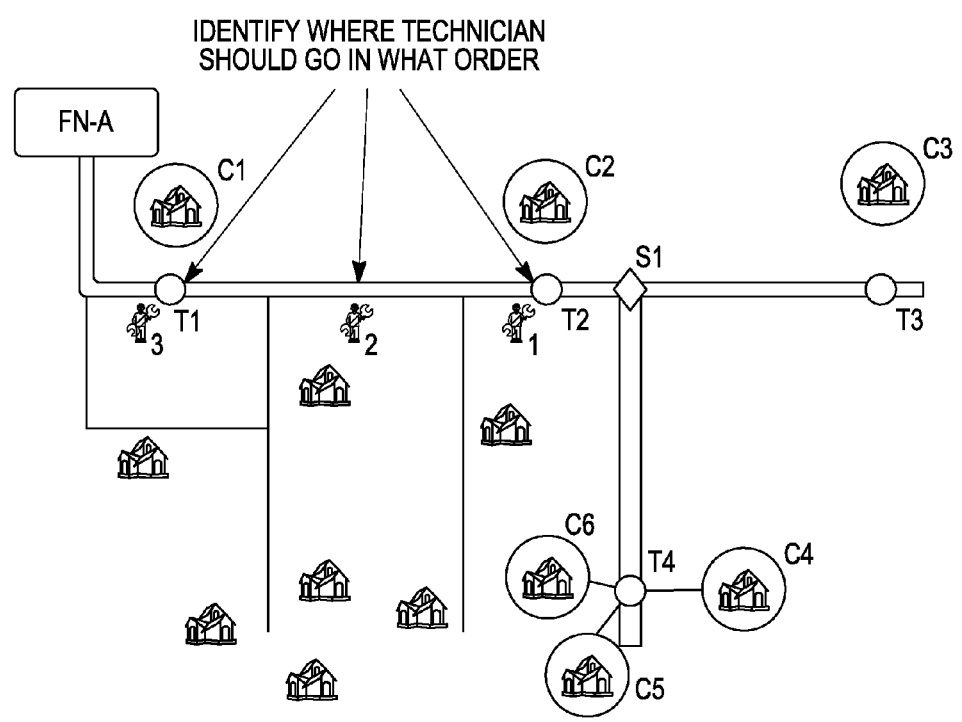
FIG. 16 is a view of a section of a network extending downstream from a node and in which cable modems subject to a power related fault are shown in accordance with an embodiment.

FIG. 16 provides an example in which an alarm threshold of the performance parameters for downstream power level, absolute and delta, are detected for a series of cable modems C1, C2, C3, C4, C5 and C6 which are all serviced via the same optic fiber node FN-A. Each of these cable modem locations is shown circled in FIG. 16. Cable modems C1, C2 and C3 are connected to taps T1, T2 and T3, respectively, and each cable modem C4, C5 and C6 is connected to tap T4. A splitter S1 is located downstream of tap T2 and provides a split of the network path to taps T3 and T4. At least one cable modem subtending a tap or slit must report power issues for an alarm to be raised and to identify a continuous power affected region of the network.

According to an embodiment, an alarm is automatically raised for the issue shown in FIG. 16 based on the detected parameters and topology of the network and provides an estimate of the location or cause of the fault and identifies the cable modems and network topology components that are affected by the issue. An algorithm for automatically estimating the location of the fault may include a depth first traversal of the topology of the network connected to node FN-A. For instance, the power status of each cable modem along the path starting with cable modems C3, C4, C5 and C6 is reported via upstream communications. A tap is identified as a possible power issue if at least one of the subtending cable modems indicates a power issue. This process is repeated recursively for cable modems C2 and then C1 until the path leads back to the node FN-A. Any tap or splitter will be identified as a possible location of the fault if at least one subtending cable modem shows power degradation.

In the example shown in FIG. 16, the above methodology will automatically estimate and identify node FN-A and tap T1 as a probable location of the fault and will identify taps T2, T3 and T4, splitter S1, and corresponding cable modems as being affected by the fault. Thus, a field technician will first be directed to tap T1 and the subtending cable for further investigation of the issue.

Figure 17:
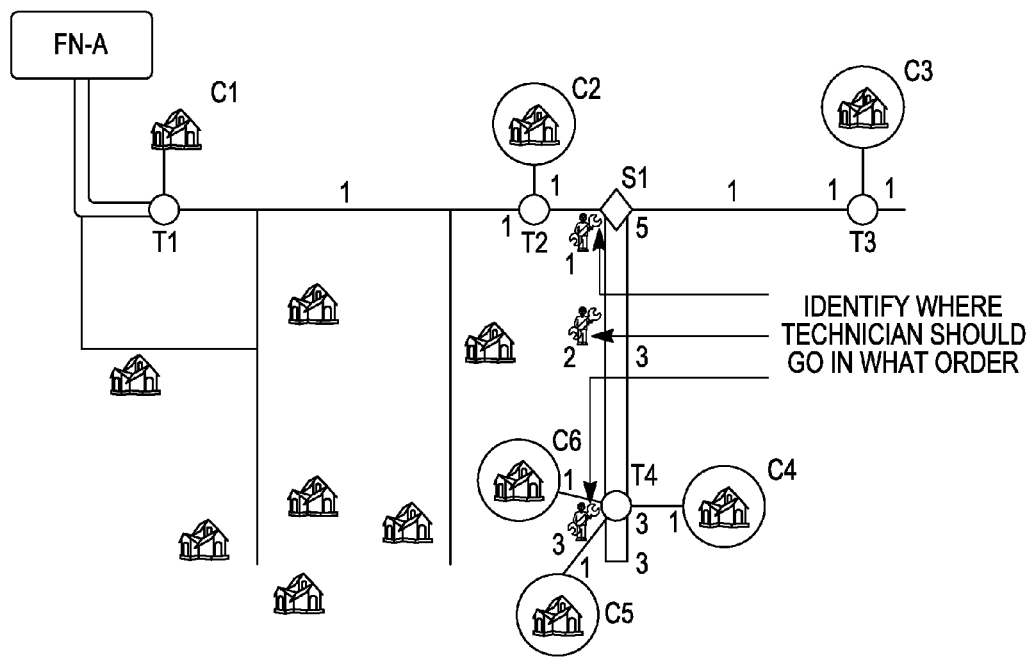
FIG. 17 is a view of a section of a network extending downstream from a node and in which cable modems subject to a reflection related fault are shown in accordance with an embodiment.

FIG. 17 provides an example in which an alarm threshold of the performance parameter related to either upstream or downstream reflection is detected for a series of cable modems C2, C3, C4, C5 and C6 which are all serviced via the same optic fiber node FN-A. Each of these cable modem locations is shown circled in FIG. 17. An alarm is automatically raised for the issue shown in FIG. 17 based on the detected parameters and topology of the network and provides an estimate of the location or cause of the fault and identifies the cable modems and network topology components that are affected by the issue.

An algorithm for automatically estimating the location of the reflection related fault may include weighting or assigning each cable drop, tap, and down feeder cable with a value of one for each cable modem reporting a reflection issue, and weighting or assigning a tap or split at a terminating end of the feeder cable with a value of 1 or less. The weight of each element or component is incremented each time referenced by a different cable modem. The fault location is estimated as the component having the highest weight.

In the example shown in FIG. 17, this methodology will weigh the drop cables of each of cable modems C2, C3, C4, C5 and C6 with a value of one. Taps T2 and T3 will also receive a value of one along with the feeder cables extending from taps T2 and T3. The tap T4 and the feeder cables extending from tap T4 will each be assigned a value of three based on each of the three cable modems C4, C5 and C6 reporting the same issue. However, the splitter S1 will be assigned a value of five since its value is incremented by one for each of the cable modems C2, C3, C4, C5 and C6 reporting an issue. Thus, the node FN-A and splitter S1 is automatically identified as the probable locations of the fault and taps T2, T3 and T4 and associated cable modems are identified as being affected by the fault. Thus, a field technician will first be directed to splitter S1 and its downstream feeder cable for further investigation of the reflection issue.

A signal processing electronic device, such as a server or remote server, can run an application to provide the above process steps and analysis. In addition, a non-transitory computer readable storage medium having computer program instructions stored thereon that, when executed by a processor, cause the processor to perform the above discussed operations can also be provided.

Determination of Network Fault Severity

A challenge associated with large scale network monitoring and alarming is proper determination and assignment of severity level to each alarm. For example, this is particularly important when dealing with extremely large networks where there may be thousands of alarms across millions of customers.

An embodiment of the present development monitors numerous performance parameters which can individually, or in concert, indicate a wide variety of performance or potential performance issues. Thus, it is necessary to consistently and accurately rate and prioritize network alarms in a manner that can scale across these very large scale networks.

According to the embodiment, a bank of parameters are monitored on the cable modems and include absolute value of the parameters, the delta in the values and the delta as a function of the absolute value for each modem. If any of these values drop below a configurable threshold, an alarm is raised. Once an alarm is raised, it is assessed for its severity level based on the following.

If an alarm is raised, but both the pre-FEC and post-FEC Bit Error Rates (BER) are acceptable, then the alarm is determined to be at the lowest (minor) level, is not service-affecting, and is a candidate for proactive maintenance at the convenience of the network operator.

If the alarm is raised and the pre-FEC BER is unacceptable, but the post-FEC BER is acceptable, then the alarm is determined to be at the middle (major) level. This is still a candidate for proactive maintenance but should be monitored for deterioration as it can quickly become service-affecting.

If the alarm is raised and the post-FEC BER is unacceptable, then the alarm is determined to be at the highest (critical) level, is service-affecting, and must be addressed.

Once the severity of the alarm is estimated as described above, the alarms within each severity level are prioritized based upon the number of customers that are affected by the alarm.

Thus, as described above, a large number of parameters are monitored, and the severity of the alarm is assigned by the pre-FEC and post-FEC error rates, and not the severity of the impairment as shown by the original performance parameter that was being monitored. In a case where a single impairment is affecting multiple customers, each alarm will be detected individually, but then the alarms will be combined into a single, higher priority alarm. Otherwise, a single network issue which is affecting several customers would be viewed as several, independent low priority alarms, when in fact resolving a single issue would address many customers simultaneously.

By way of example, an embodiment may include estimating a level of severity of a network fault by monitoring performance parameters on upstream and downstream links to terminal network elements on a network to detect potential network faults and raising an alarm with respect to a potential network fault automatically if at least one of the performance parameters obtained crosses a preset threshold. After an alarm is raised, a level of severity is assigned to the alarm automatically based on pre and post forward error correction (FEC) bit error rates (BER) with respect to communications between an impacted terminal network element and headend equipment of the network, such as the CMTS. A total number of terminal network elements that may be impacted by the network fault is estimated and, when multiple alarms are raised of an equal level of severity, a higher priority is placed upon an alarm that affects service to a greatest number of terminal network elements.

The level of severity may be assigned a lower level of severity when the pre-FEC BER is within a predetermined acceptable range for pre-FEC BER and the post-FEC BER is within a predetermined acceptable range for post-FEC BER as compared to when at least one of the pre-FEC BER and the post-FEC BER is outside of its respective predetermined acceptable range. Further, the level of severity may be assigned a higher level of severity when the post-FEC BER falls outside of a predetermined acceptable range for post- FEC BER as compared to when the post-FEC BER is within the predetermined acceptable range.

Following the detection of a fault and the assignment of severity level, a geographically-accurate map can be automatically populated with a geographic location of a network component to which the network fault is attributed, a geographic location of each terminal network element impacted by the network fault, and a diagnostic alarm identifying the network fault and the level of severity of the network fault. The map may be displayable via geospatial software.

A signal processing electronic device, such as a server or remote server, can run an application to provide the above operations. In addition, a non-transitory computer readable storage medium having computer program instructions stored thereon that, when executed by a processor, cause the processor to perform the above discussed operations can also be provided.

The above referenced signal processing electronic devices for carrying out the above methods can physically be provided on a circuit board or within another electronic device and can include various processors, microprocessors, controllers, chips, disk drives, and the like. It will be apparent to one of ordinary skill in the art the modules, processors, controllers, units, and the like may be implemented as electronic components, software, hardware or a combination of hardware and software.

While the principles of the invention have been described above in connection with specific networks, devices, apparatus, systems, and methods, it is to be clearly understood that this description is made only by way of example and not as limitation on the scope of the invention as defined in the appended claims.

We claim:

1. A method of estimating a physical location of a network fault producing linear distortion or excessive loss impairments, comprising the steps of:
    receiving information electronically of a physical topology of a network, said receiving step including data pulls of information concerning network components and geographic locations of the network components and terminal network elements and geographic locations of the terminal network elements;
    detecting the network fault by automatically and electronically monitoring at least one performance parameter transmitted via upstream communications from the terminal network elements on the network;
    automatically estimating the physical location of the network fault on the network based on the at least one performance parameter obtained during said detecting step, the information of the physical topology of the network obtained during said receiving step, and the terminal network element or elements from which the at least one performance parameter was received that indicated the network fault; and
    automatically generating a list of network components that require inspection and may provide a source of the network fault;
    wherein the at least one performance parameter includes an upstream filter coefficient ratio that equals 10*log(TCE/TE), where TCE is a sum of energy used by an equalizer of the terminal network element for correction of upstream signals in all taps of the equalizer except a main tap and TE is a sum of energy used by the equalizer of the terminal network element for correction of upstream signals in all taps of the equalizer including the main tap.

2. The method according to claim 1 wherein the network components are selected from a group consisting of drop cables, taps, trunk cables, amplifiers, and node components.

3. The method according to claim 1, wherein the network is a hybrid fiber-coaxial (HFC) network interconnecting the terminal network elements which include cable modems to a headend of the network having a cable modem termination system (CMTS) via a tree and branch network structure, and wherein the upstream communications are in a direction from the terminal network elements to the headend.

4. The method according to claim 1, wherein the at least one performance parameter monitored during said detecting step includes at least one of absolute and delta downstream power level, absolute and delta upstream power level, microreflections, upstream filter coefficient ratio, carrier-to-noise ratio (CNR)/signal-to-noise ratio (SNR), and modulation error ratio (MER).

5. The method according to claim 1, wherein, if during said detecting step, the at least one performance parameter provided by only a single terminal network element in a common serving group of terminal network elements identifies an unacceptable drop in downstream power level and upstream power level, then said estimating step automatically identifies a drop cable of the single terminal network element, a tap associated with the drop cable, and a trunk cable feeding the tap as the physical location of the network fault.

6. The method according to claim 1, wherein, if during said detecting step, the at least one performance parameter provided by multiple terminal network elements within a common serving group of terminal network elements identify an unacceptable drop in downstream power level and upstream power level, then said estimating step automatically identifies a drop cable of one of the multiple terminal network elements that is furthest upstream on a path of the network, a tap associated with the drop cable that is furthest upstream, and a trunk cable feeding the tap that is furthest upstream as the physical location of the network fault.

7. The method according to claim 1, wherein, if during said detecting step, the at least one performance parameter provided by only a single terminal network element in a common serving group of terminal network elements identifies an unacceptable level of at least one of microreflections and upstream filter coefficient ratio and a marginally acceptable absolute power level, then said estimating step automatically identifies a drop cable of the single terminal network element, a tap associated with the drop cable, and a trunk cable feeding the tap as the physical location of the network fault.

8. The method according to claim 1, wherein, if during said detecting step, the at least one performance parameter provided by multiple terminal network elements within a common serving group identify an unacceptable level of at least one of microreflections and upstream filter coefficient ratio and a marginally acceptable absolute power level, then said estimating step automatically identifies drop cables of the multiple terminal network elements, taps associated with the drop cables, and a trunk cable feeding the taps as the physical location of the network fault.

9. The method according to claim 1, wherein, if during said detecting step, the at least one performance parameter provided by multiple terminal network elements within a common serving group identify an unacceptable level of microreflections and upstream and downstream power level, then said estimating step automatically identifies a drop cable of the multiple terminal network elements that is furthest upstream on a path of the network, a tap associated with the drop cable that is furthest upstream, and a trunk cable feeding the tap that is furthest upstream as the physical location of the network fault.

10. The method according to claim 1, wherein, if during said detecting step, the at least one performance parameter provided by at least one of the terminal network elements indicates an unacceptable level of only one of upstream power level and downstream power level, then said estimating step automatically identifies at least one of an amplifier and a node component which is in a network path to the at least one of the terminal network elements on the network as the physical location of the network fault.

11. The method according to claim 1, wherein, if during said detecting step, the at least one performance parameter provided by at least one of the terminal network elements indicates an unacceptable level of at least one of CNR/SNR and MER and acceptable levels of downstream and upstream power, then said estimating step automatically identifies at least one of an amplifier and a node component which is in a network path to the at least one of the terminal network elements on the network as the physical location of the network fault.

12. The method according to claim 1, wherein, if during said detecting step, the performance parameter provided by at least one of the terminal network elements indicates an unacceptable level of at least one of CNR/SNR and MER and unacceptable levels of downstream and upstream power, then said estimating step automatically identifies a drop cable of the at least one of the terminal network elements, a tap associated with the drop cable, and a trunk cable feeding the tap as the physical location of the network fault.

13. The method according to claim 1, further comprising the step of automatically and electronically populating a geographically-accurate map with a geographic location of a network component to which the network fault is attributed, a geographic location of each the terminal network elements impacted by the network fault, and a diagnostic alarm identifying the network fault, the geographically-accurate map being displayable via geospatial software.

14. A signal processing electronic device for populating a display of an interactive graphical user interface with a diagnostic alarm corresponding to a fault detected on a network, comprising at least one processing unit configured to:
receive information electronically of a physical topology of the network via data pulls of information concerning network components, geographic locations of the network components, terminal network elements, and geographic locations of the terminal network elements;
detect a network fault by automatically and electronically monitoring at least one performance parameter transmitted via upstream communications from the terminal network elements on the network;
automatically estimate a physical location of the network fault on the network based on the at least one performance parameter, the information of the physical topology of the network, and the terminal network element or elements from which the at least one performance parameter was received that indicated the network fault; and
automatically generate a list of network components that require inspection and may provide a source of the network fault;
wherein the at least one performance parameter includes an upstream filter coefficient ratio that equals 10*log(TCE/TE), where TCE is a sum of energy used by an equalizer of the terminal network element for correction of upstream signals in all taps of the equalizer except a main tap and TE is a sum of energy used by the equalizer of the terminal network element for correction of upstream signals in all taps of the equalizer including the main tap.

15. The signal processing electronic device according to claim 14, wherein the signal processing electronic device is a server connected to the network, wherein the network is a hybrid fiber-coaxial (HFC) network interconnecting the terminal network elements which include cable modems to a headend of the network having a cable modem termination system (CMTS) via a tree and branch network structure, and wherein the upstream communications are in a direction from the terminal network elements to the headend.

16. The signal processing electronic device according to claim 14, wherein the at least one performance parameter includes at least one of absolute and delta downstream power level, absolute and delta upstream power level, microreflections, upstream filter coefficient ratio, carrier-to-noise ratio (CNR)/signal-to-noise ratio (SNR), and modulation error ratio (MER).

17. The signal processing electronic device according to claim 14, wherein said at least one processing unit automatically populating a geographically-accurate map with a geographic location of a network component to which the network fault is attributed, a geographic location of each of the terminal network elements impacted by the network fault, and a diagnostic alarm identifying the network fault, the geographically-accurate map being displayable via geospatial software.

18. A non-transitory computer readable storage medium comprising instructions that when executed by a data processing apparatus in communication with the non-transitory computer readable storage medium cause the data processing apparatus to:
receive information electronically of a physical topology of a network via data pulls of information concerning network components, geographic locations of the network components, terminal network elements, and geographic locations of the terminal network elements;
detect a network fault by automatically and electronically monitoring at least one performance parameter transmitted via upstream communications from the terminal network elements on the network;
automatically estimate a physical location of the network fault on the network based on the at least one performance parameter, the information of the physical topology of the network, and the terminal network element or elements from which the at least one performance parameter was received that indicated the network fault; and
automatically generate a list of network components that require inspection and may provide a source of the network fault;
wherein the at least one performance parameter includes an upstream filter coefficient ratio that equals 10*log(TCE/TE), where TCE is a sum of energy used by an equalizer of the terminal network element for correction of upstream signals in all taps of the equalizer except a main tap and TE is a sum of energy used by the equalizer of the terminal network element for correction of upstream signals in all taps of the equalizer including the main tap.

* * * * *